(12) United States Patent
Li et al.

(10) Patent No.: US 11,309,035 B1
(45) Date of Patent: Apr. 19, 2022

(54) ALL BIT LINE SENSING FOR DETERMINING WORD LINE-TO-MEMORY HOLE SHORT CIRCUIT

(71) Applicant: Western Digital Technologies, Inc., San Jose, CA (US)

(72) Inventors: Liang Li, Shanghai (CN); Xiaohua Liu, Shanghai (CN); Qianqian Yu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/098,831

(22) Filed: Nov. 16, 2020

(30) Foreign Application Priority Data

Nov. 9, 2020 (CN) .......................... 202011237818.7

(51) Int. Cl.
| | |
|---|---|
| *G11C 16/04* | (2006.01) |
| *G11C 16/24* | (2006.01) |
| *G11C 16/26* | (2006.01) |
| *H01L 27/11582* | (2017.01) |
| *H01L 27/11556* | (2017.01) |

(52) U.S. Cl.
CPC .......... *G11C 16/24* (2013.01); *G11C 16/0483* (2013.01); *G11C 16/26* (2013.01); *H01L 27/11556* (2013.01); *H01L 27/11582* (2013.01)

(58) Field of Classification Search
CPC ..... G11C 16/24; G11C 16/0483; G11C 16/26; H01L 27/11556; H01L 27/11582

USPC .................................................... 365/185.17
See application file for complete search history.

(56) References Cited

U.S. PATENT DOCUMENTS

| 8,902,657 | B2 * | 12/2014 | Iwai ................. | H01L 27/11582 |
| | | | | 365/185.11 |
| 8,917,557 | B2 * | 12/2014 | Sakaguchi ............ | G11C 16/26 |
| | | | | 365/185.25 |
| 9,236,131 | B1 | 1/2016 | Yuan et al. | |
| 9,406,690 | B2 | 8/2016 | Pang et al. | |
| 9,785,493 | B1 | 10/2017 | Zhang et al. | |
| 10,217,762 | B2 | 2/2019 | Yu et al. | |
| 10,665,313 | B1 | 5/2020 | Lu et al. | |
| 2014/0369127 | A1 * | 12/2014 | Hara ...................... | G11C 16/26 |
| | | | | 365/185.17 |

* cited by examiner

*Primary Examiner* — Tha-O H Bui
(74) *Attorney, Agent, or Firm* — Vierra Magen Marcus LLP

(57) ABSTRACT

Apparatuses and techniques for detecting short circuits in a memory device, and in particular, word line-to-channel short circuits and short circuits between bit line contacts at the top of NAND strings. A short circuit detection operation includes a channel pre-clean phase which discharges a channel of a non-short circuited NAND string while boosting a bit line of a short circuited NAND string, followed by a bit line pre-charge phase which boosts a bit line of the non-short circuited NAND string, followed by a bit line discharge phase which discharges the bit line of the non-short circuited NAND string, followed by a sensing phase which identifies the short circuited NAND strings as being in a programmed or non-conductive state.

20 Claims, 34 Drawing Sheets

Fig. 1A
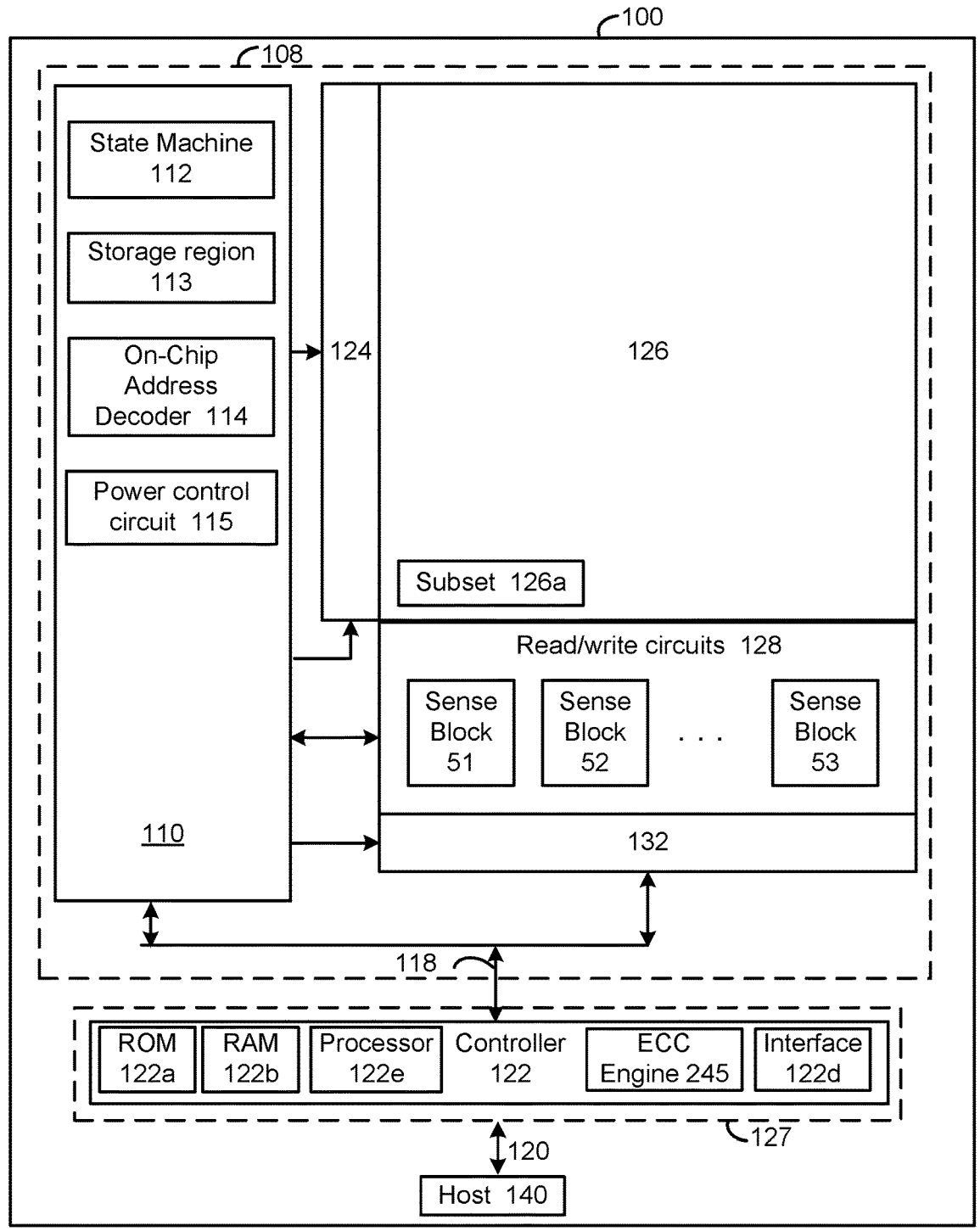
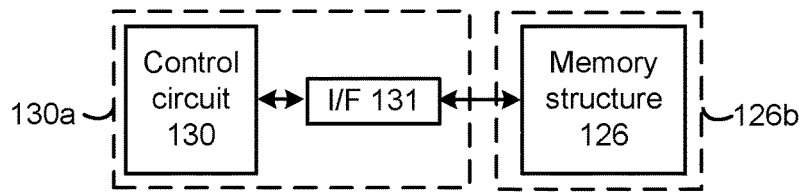
Fig. 1B

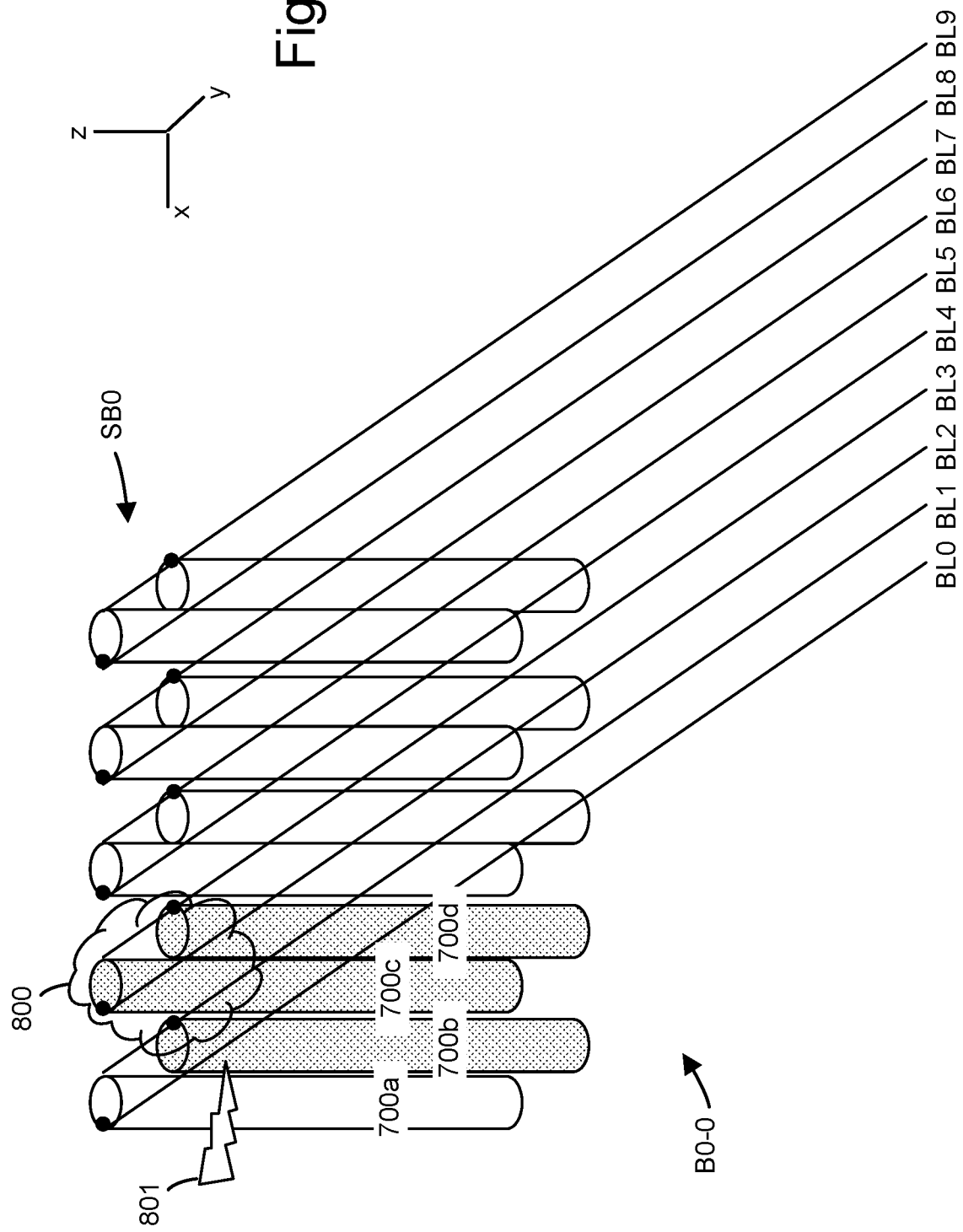

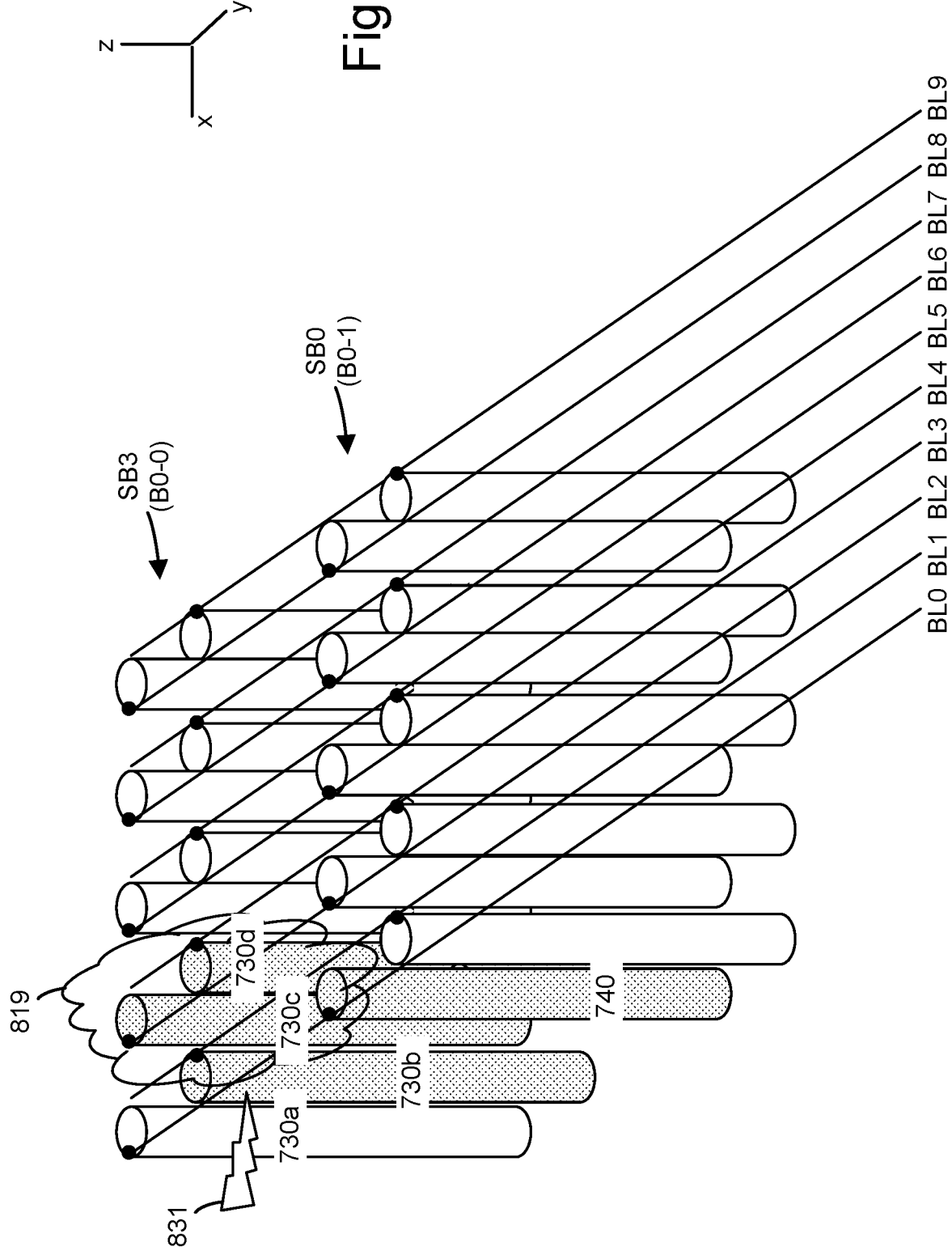

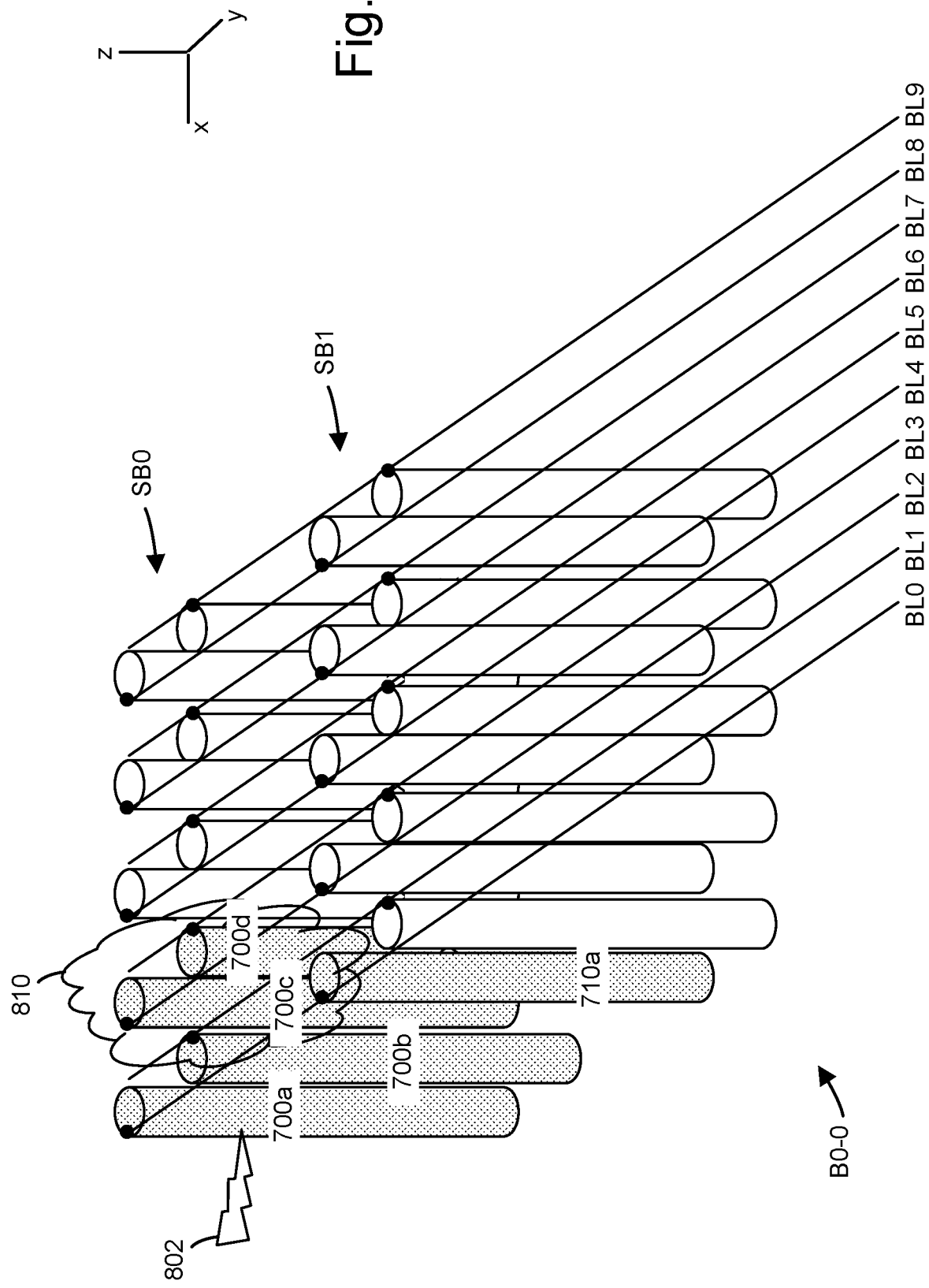

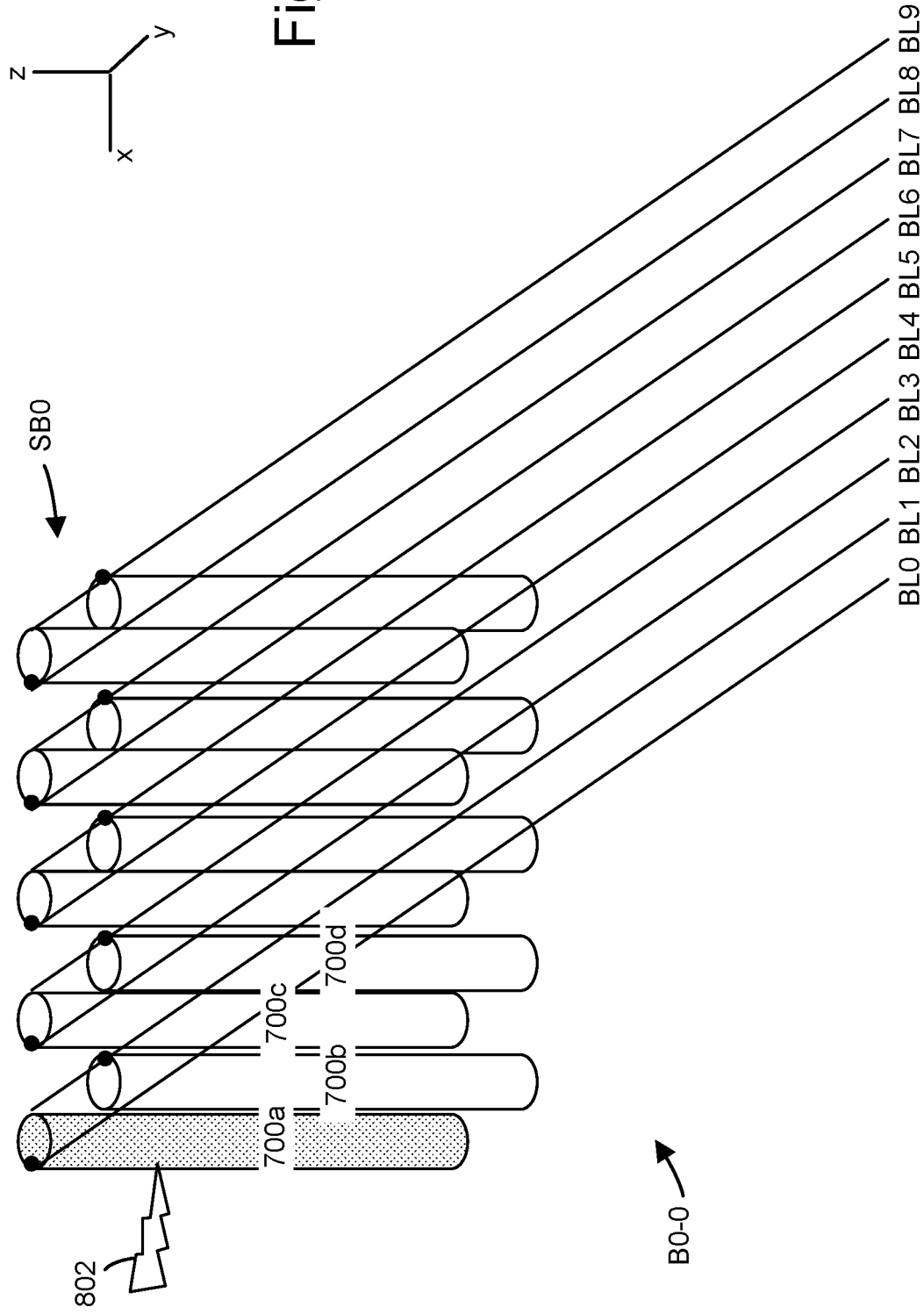

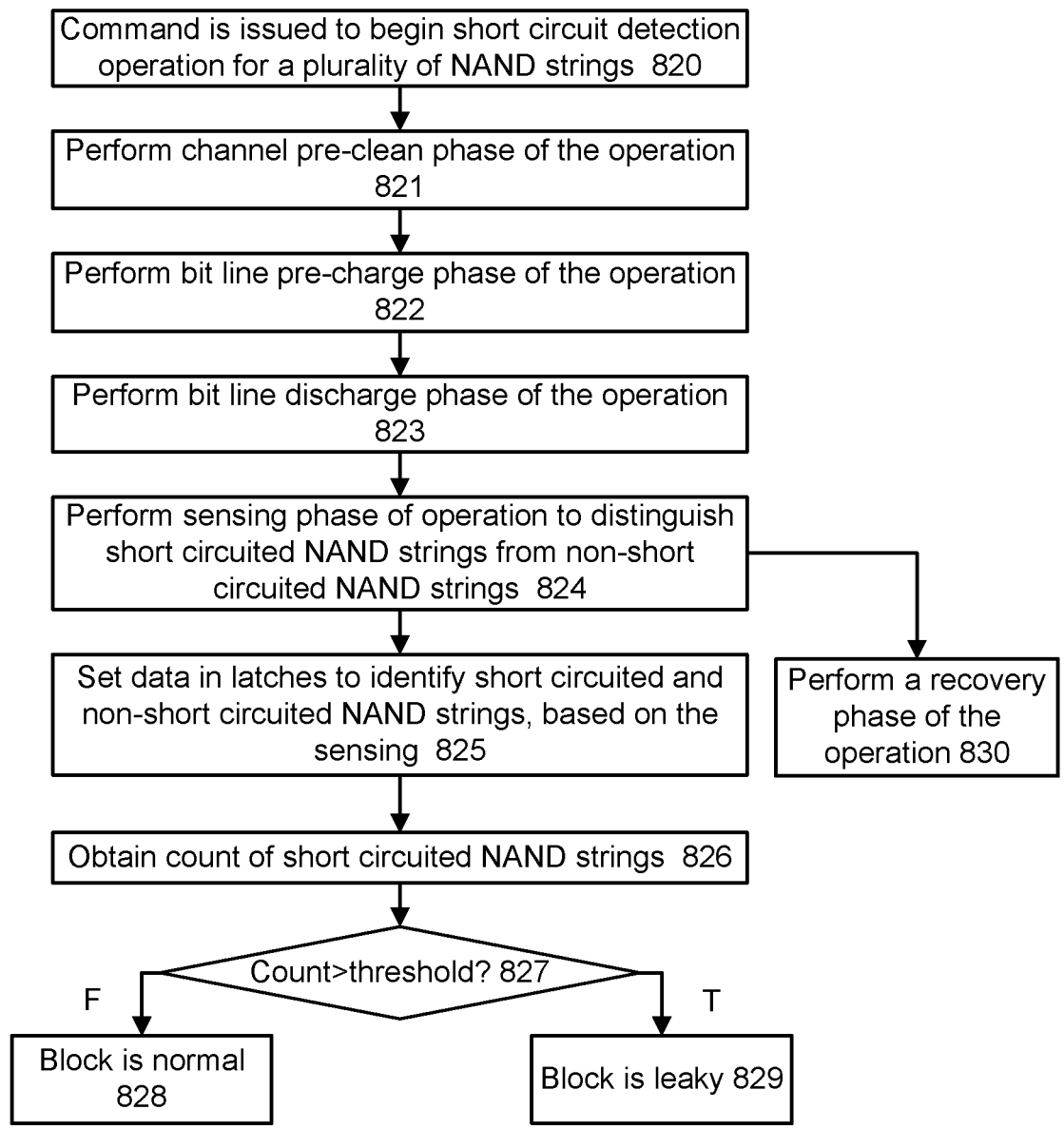

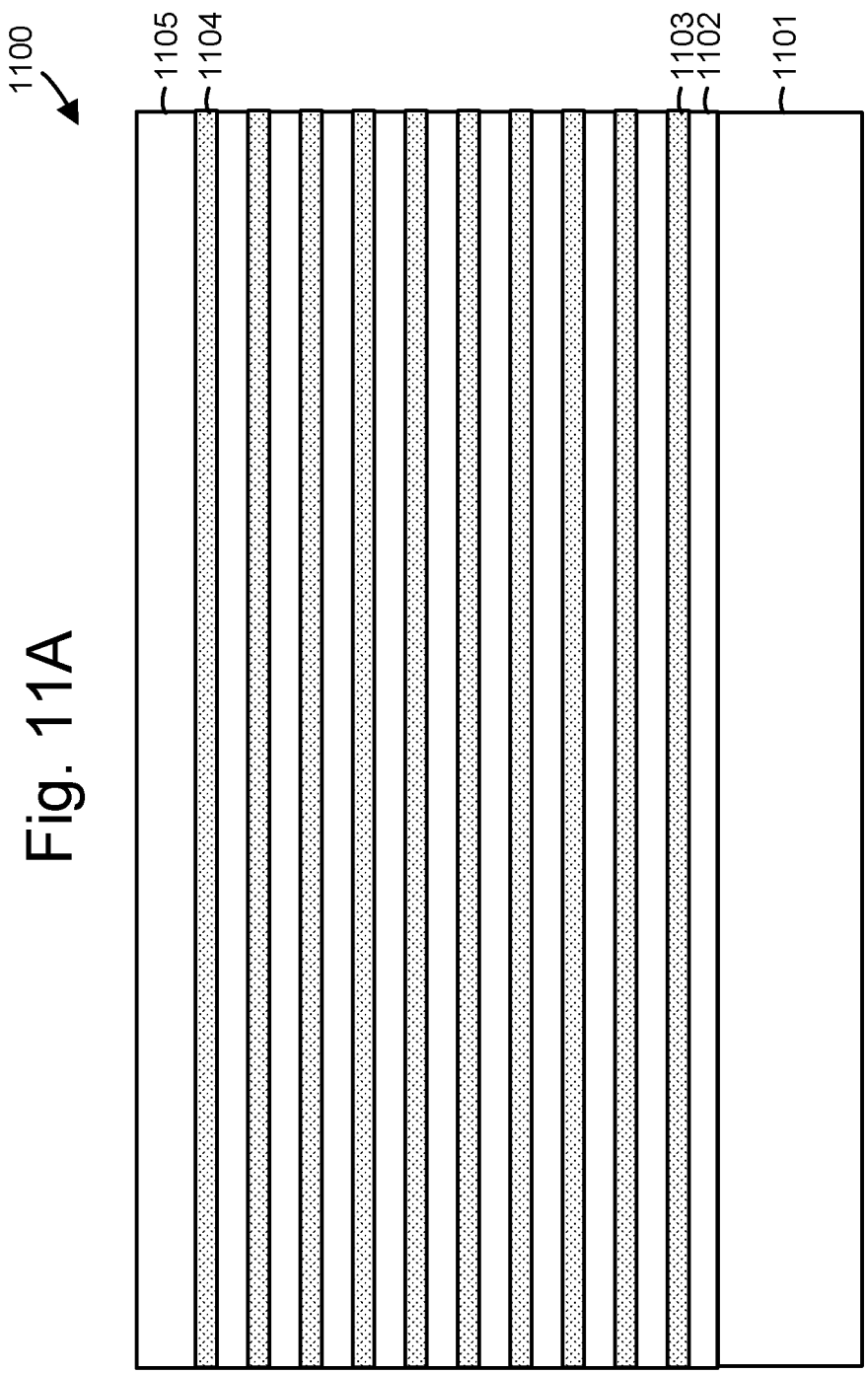

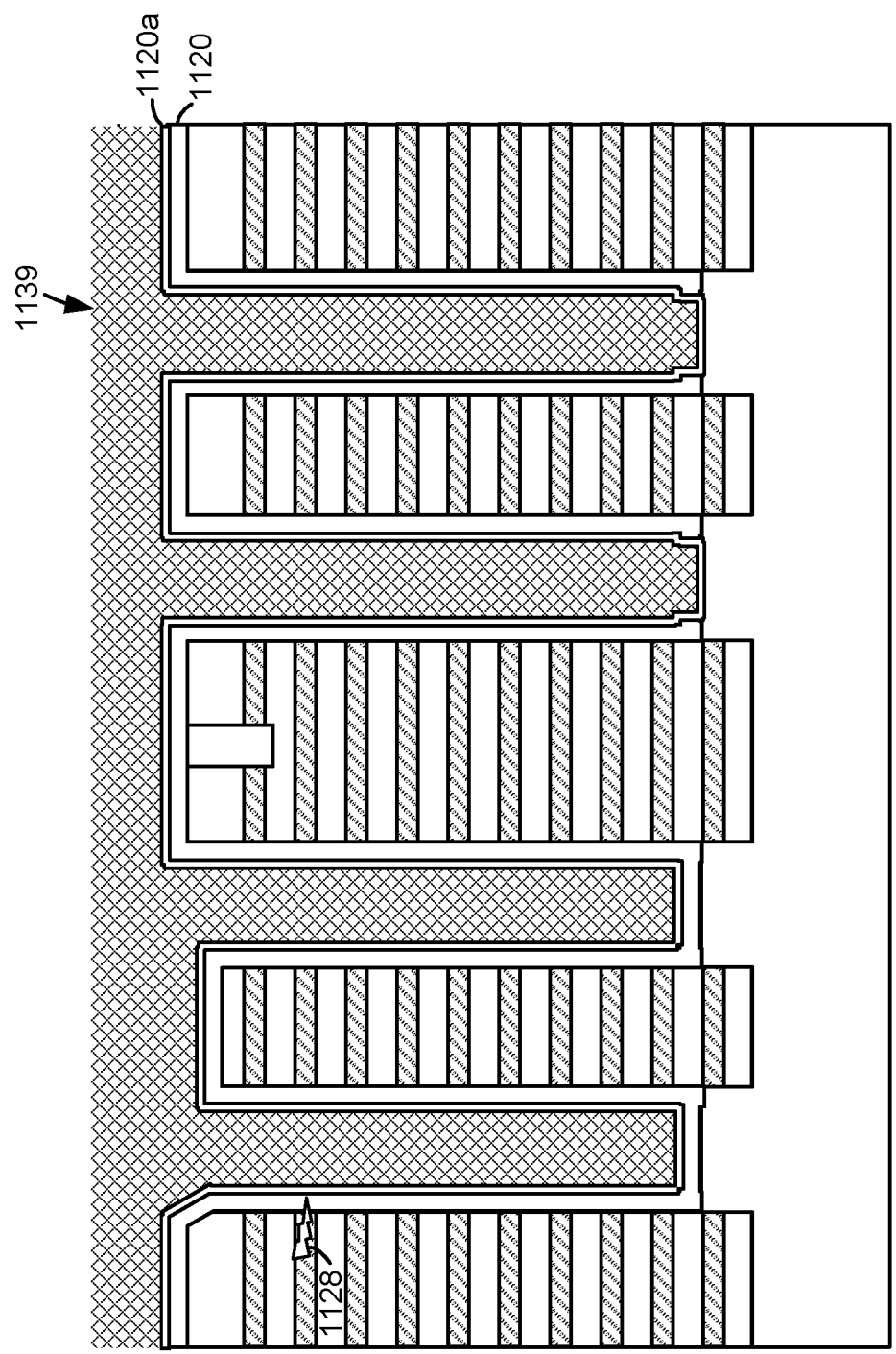
Fig. 11F1

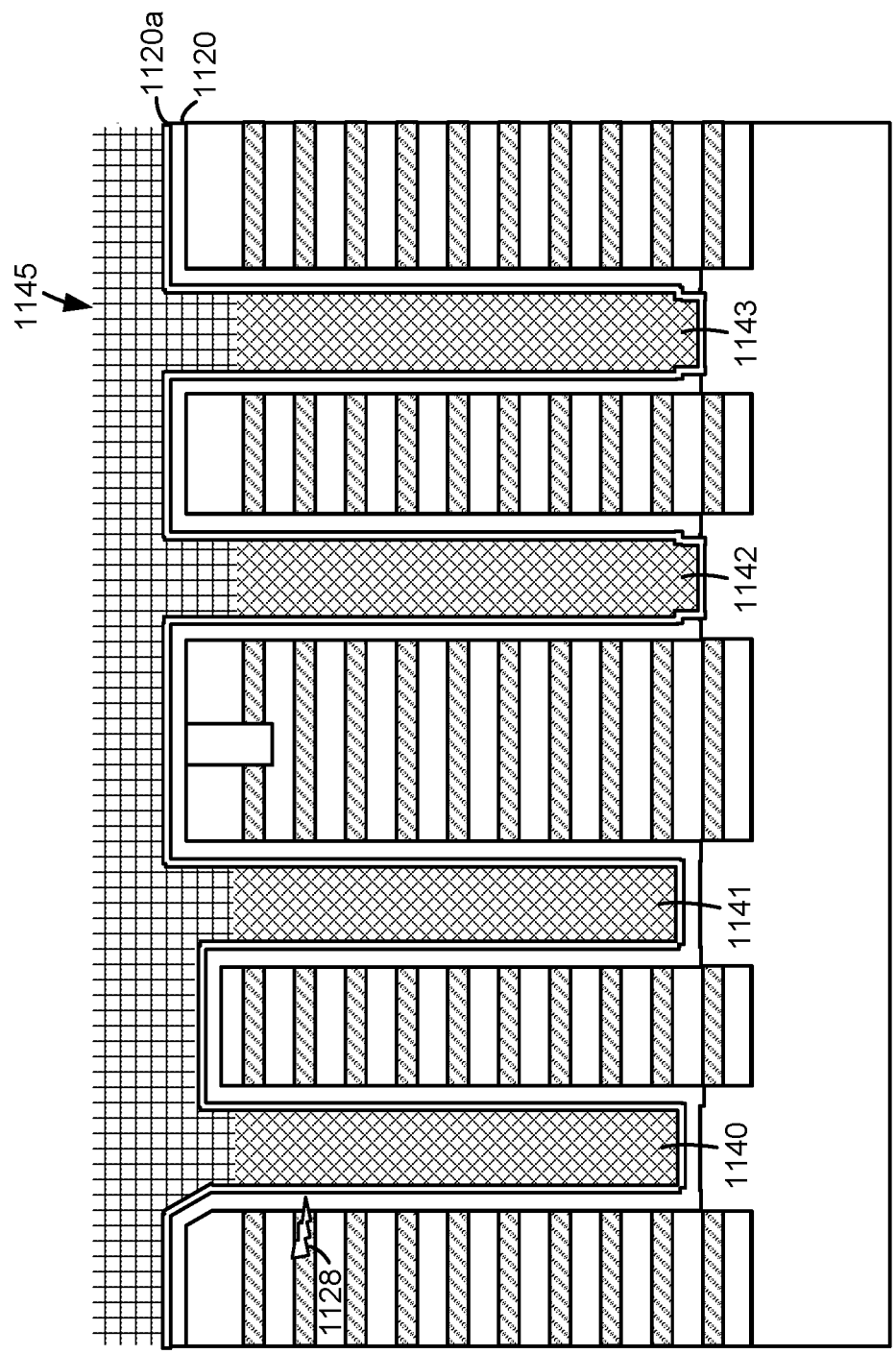
Fig. 11F2

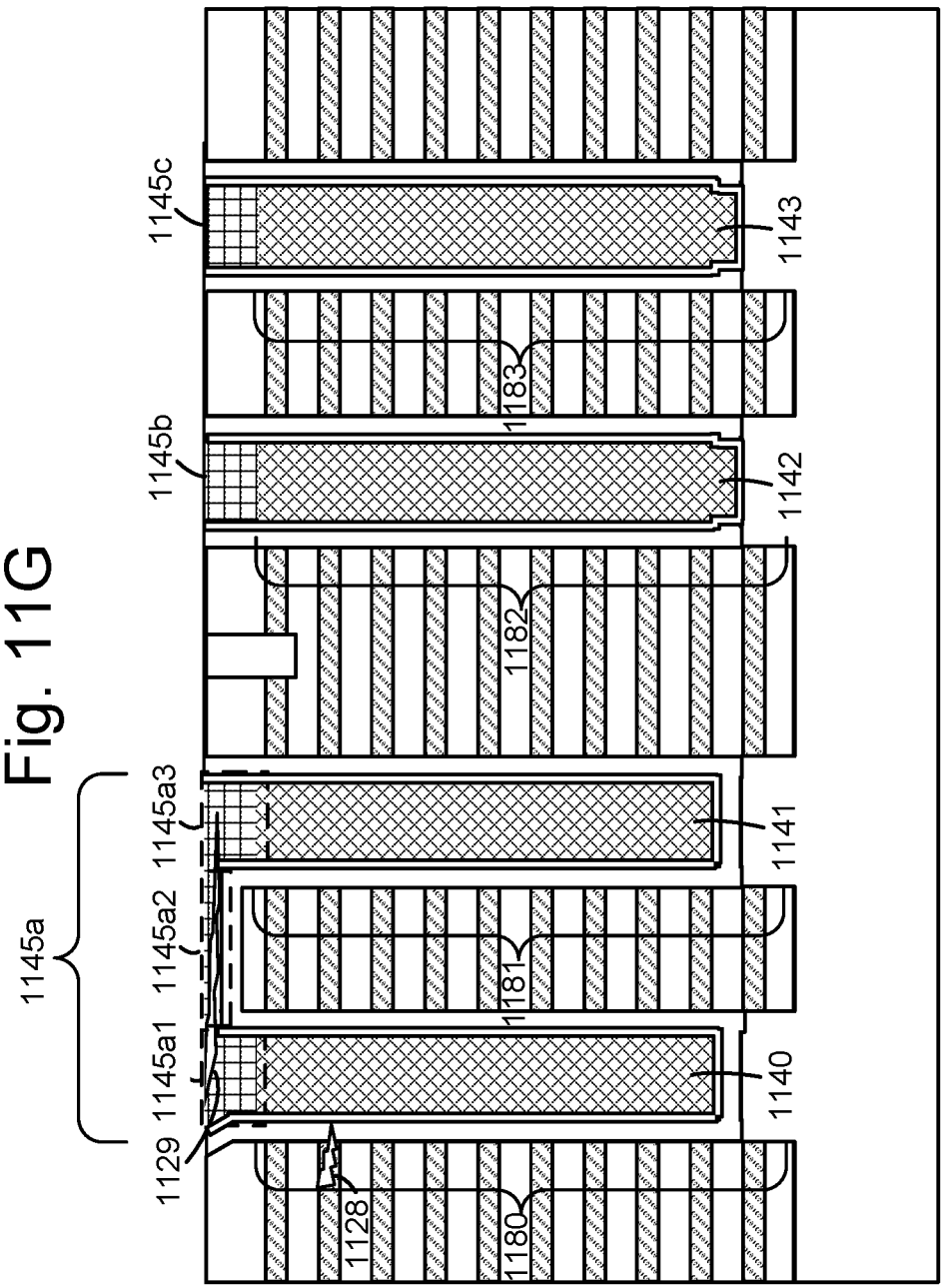

ALL BIT LINE SENSING FOR DETERMINING WORD LINE-TO-MEMORY HOLE SHORT CIRCUIT

CLAIM OF PRIORITY

This application claims priority to Chinese Patent Application No. 202011237818.7, entitled "ALL BIT LINE SENSING FOR DETERMINING WORD LINE-TO-MEMORY HOLE SHORT CIRCUIT," filed Nov. 9, 2020, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. For example, a charge-trapping material can be arranged vertically in a three-dimensional (3D) stacked memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 7C depicts an example of a first failure mode consistent with FIG. 7B, where in SB0, a NAND string 700b has a word line-to-channel short circuit path 801, and a cluster of NAND strings 800 comprising NAND strings 700b-700d are short circuited to one another.

FIG. 7E depicts an example of a third failure mode consistent with FIGS. 4 and 7B, where in SB3 of B0-0, a NAND string 730b has a word line-to-channel short circuit path 831, and a cluster of NAND strings 819 comprising NAND strings 730b-730d in SB3 and NAND string 740 in SB0 of an adjacent block B0-1 are short circuited to one another.

FIG. 7F depicts an example of a fourth failure mode consistent with FIG. 7B, where in SB0, a NAND string 700a has a word line-to-channel short circuit path 802, and a cluster of NAND strings 810 comprising NAND strings 700b-700d in SB0 and NAND string 710a in SB1 are short circuited to one another.

FIG. 7G depicts an example of a fifth failure mode consistent with FIG. 7B, where in SB0, a NAND string 700a has a word line-to-channel short circuit path 802, and no NAND strings are short circuited to one another.

FIG. 8 depicts a flowchart of an example process for performing a short circuit detection operation, consistent with the failure scenarios of FIG. 7C to 7G.

FIG. 11A depicts a first configuration of a block in a fabrication process which results in a short circuit consistent with FIGS. 6 and 7C to 7G, where alternating layers are formed in a stack.

FIG. 11F1 depicts a sixth configuration of a block in a fabrication process, where an additional polysilicon layer 1120a and a dielectric material 1139 are deposited.

FIG. 11F2 depicts a seventh configuration of a block in a fabrication process, where the dielectric material is etched back to form dielectric cores 1140-1143 in the memory holes, after which a doped silicon cap layer 1145 is deposited.

FIG. 11G depicts an eighth configuration of a block in a fabrication process, where the doped silicon cap layer 1145 is etched to form bit line contacts 1145a1, 1145a3, 1145b and 1145c.

DETAILED DESCRIPTION

Figure 2:
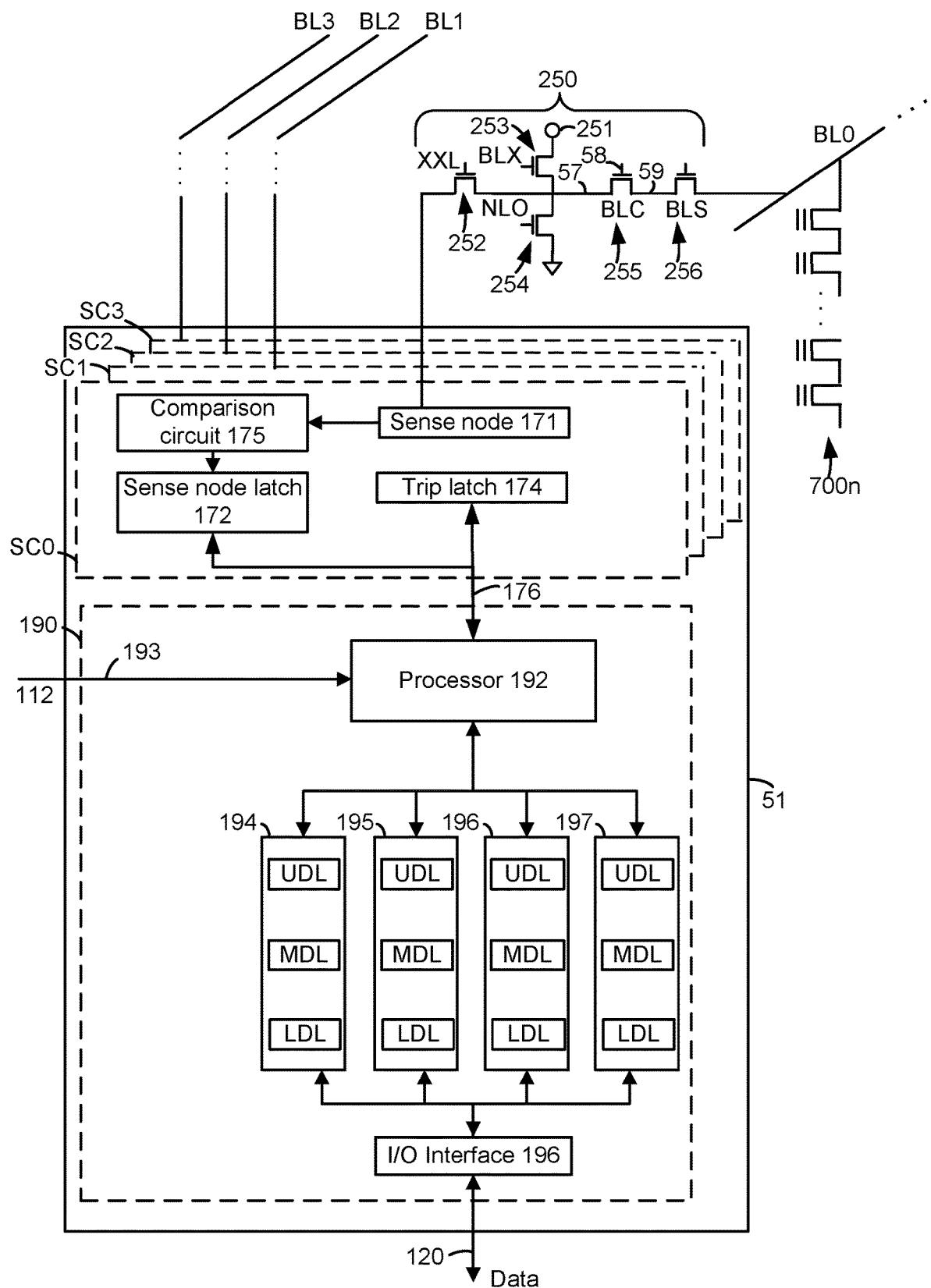
FIG. 2 is a block diagram depicting one embodiment of the sense block 51 of FIG. 1A.

Apparatuses and techniques are described for detecting short circuits in a memory device, and in particular, word line-to-channel short circuits and short circuits between bit line contacts at the top of NAND strings.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts as a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers comprising, e.g., Tungsten, act as word lines which are connected to the memory cells. Each NAND string is formed by etching a memory hole in the stack and depositing various layers along the wall of the memory hole. For example, these layers can include a blocking oxide layer 663 (e.g., aluminum oxide), a charge-trapping layer 664 (e.g., silicon nitride or other nitride), a tunneling layer 665 (e.g., a gate oxide) and a channel layer 660 (e.g., comprising polysilicon) in the NAND string 700n in FIG. 6. The materials provide a MANOS or metal (W)-aluminum oxide (Al2O3)-nitride (Si3N4)-oxide (SiO2)-silicon (Si) structure.

Each NAND string may have the shape of a pillar which intersects with the word lines to form the memory cells. A source end 700s of the NAND string is connected to the substrate 611 and a drain end 700d of the NAND string is connected to a bit line, BL0.

Memory structures, including those described above, are widely used for storage and data transfer in consumer devices, enterprise systems and industrial applications, for example, because of their nonvolatile capability, affordability, high storage density and access speed. However, various short circuit failure modes can occur due to process defects such as degassing of Fluorine (F) and the presence of contaminating particles. F degassing typically causes short circuits between the word line and the channel for bottom and middle word lines of the stack. A NAND with a short circuit is referred to as a leaky NAND string.

Figure 6:
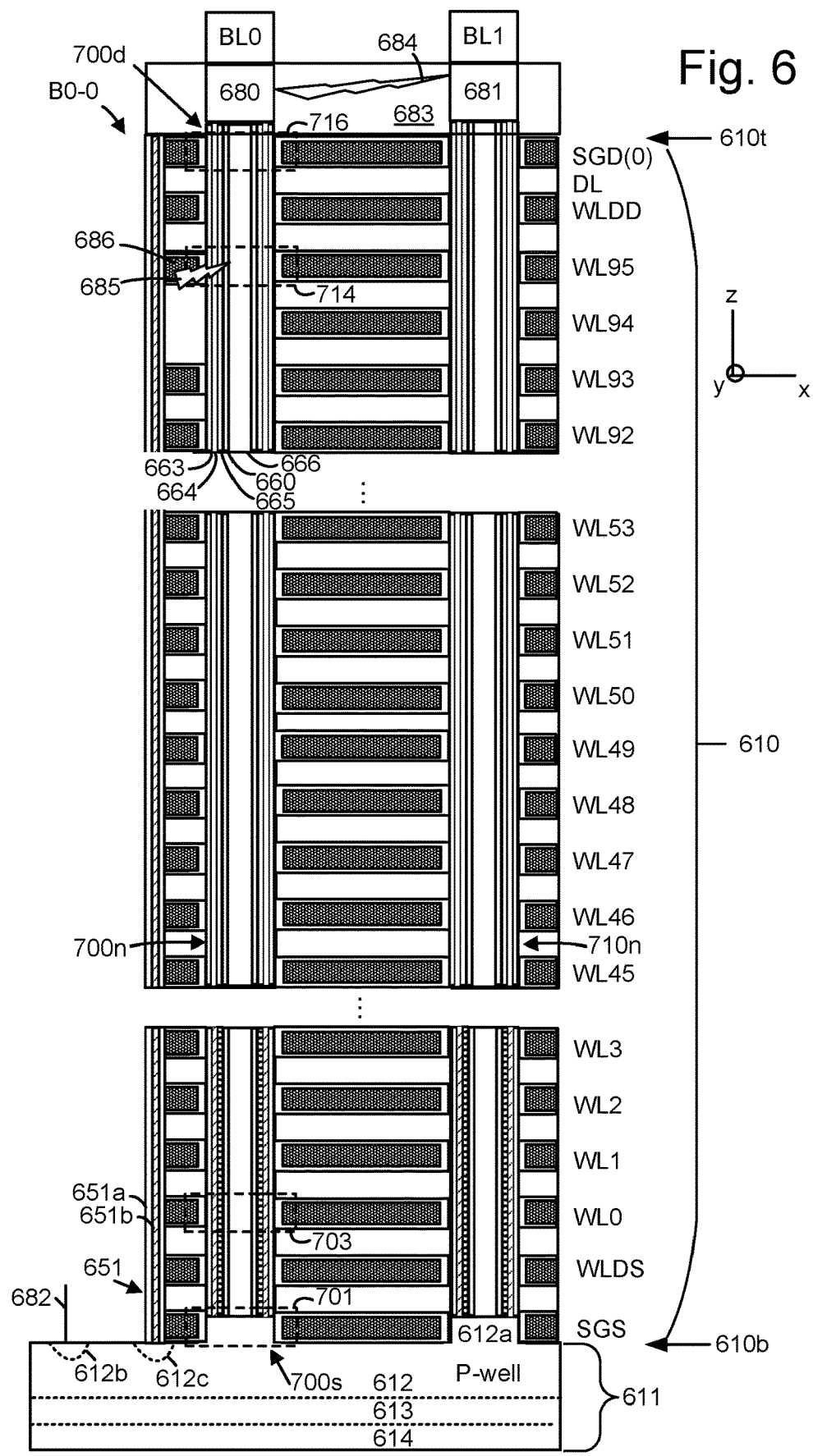
FIG. 6 depicts an example cross-sectional view of a portion of the block B0-0 of FIG. 4, including NAND strings 700n and 710n.

In contrast, contaminating particles typically cause short circuits between the word line and the channel for top word lines of the stack (see, e.g., the short circuit path 686 between WL95 and the channel layer 660 in FIG. 6). In particular, the contaminating particles can cause uneven deposition and etching at the top of the stack. This can result in etch particles refracting from irregular surfaces and damaging a portion of the layers in the memory hole, such as during etching of the memory holes to open a path at the bottom of the memory hole. For example, see the damaged region 1127 in FIG. 11E. This causes a word line-to-channel short circuit path 1128, also referred to as a word line-to-memory hole short circuit path. Additionally, the bottom of the memory hole may remain unopened (see the bottoms 1130 and 1131 of the memory holes in FIG. 11E), so that the source line is not connected to the channel. The uneven etching of the top of the stack also results in a short circuit between bit line contacts at the tops of the NAND strings (see the short circuit path 684 between the bit line contacts 680 and 681 in the doped silicon region 683 in FIG. 6, or the short circuit path 1129 between the bit line contacts 1145a1 and 1145a3 in the doped silicon region 1145a in FIG. 11G).

The short circuits can interfere with a program operation by pulling down a word line voltage, and in an erase operation by pulling up the word line voltage. This can lead to a block level failure. The short circuits typically appear in a cluster of adjacent NAND strings (see the cluster of NAND strings 800 in FIG. 7C).

One approach is to test the current in a NAND string, which is expected to be in an erased (conductive) state. If the current is below a specified level, the NAND string is instead considered to be in a programmed (non-conductive) state. However, this approach does not distinguish between a word line-to-channel short circuit and an unopened memory hole. A NAND string with an unopened memory hole can be accommodated based on a bit ignore setting during program verify and read, for example, since this NAND string does not affect other NAND strings. On the other hand, a NAND string with a word line-to-channel short circuit affects other NAND strings because the word line voltage is affected. Accordingly, a column or other set of NAND strings may be deemed unusable when there are unopened memory holes which can be accommodated. This results in a yield loss.

Another approach involves using voltage sensing. A bit line pre-charge voltage and a sense voltage of a sense circuit can be separately adjusted. When the sense voltage decreases, a NAND string with an opened or unopened memory hole is sensed as being in the erased state (a 1 bit), while a NAND string with a word line-to-channel short circuit is sensed as being in the programmed state (a 0 bit). However, when sensing a bit line for the presence of a short circuit, the adjacent bit lines are set at ground, in an odd/even bit line sensing process. This approach does not work when there is a cluster of NAND strings with short circuits, in which case the voltage of a sensed bit line can be pulled down by a short circuit to an adjacent bit line. In this case, the sensed bit line/NAND string is sensed as being in the erased state.

Techniques provided herein address the above and other issues. In one aspect, a short circuit detection operation is performed for a plurality of NAND strings, such as a block or portion of a block. The operation includes a channel pre-clean phase, followed by a bit line pre-charge phase, followed by a bit line discharge phase followed by a sensing phase. See, e.g., the flowchart of FIG. 8 and the voltage signals of 10. The channel pre-clean phase discharges a channel of a non-short circuited NAND string while boosting a bit line of a short circuited NAND string. The bit line pre-charge phase boosts a bit line of the non-short circuited NAND string while the boosting is maintained on the bit line of the short circuited NAND string. The bit line discharge phase discharges the bit line of the non-short circuited NAND string while the boosting is maintained on the bit line of the short circuited NAND string. The sensing phase identifies the short circuited NAND strings as being in a programmed or non-conductive state based on their relatively low current, and identifies the non-short circuited NAND strings as being in an erased or conductive state based on their relatively high current. If a count of the short circuited NAND strings exceeds a threshold number, the plurality of NAND strings are considered to be excessively leaky and therefore unusable. If the count does not exceed the threshold number, the plurality of NAND strings are considered to be usable, while accommodations can be made for the leaky NAND strings.

The sensing phase can advantageously sense all bit lines and their respective NAND strings concurrently, in an all bit line sensing. All bit line sensing involves sensing a group of adjacent bit lines concurrently. This can be all, or a portion, of bit lines for a block of memory cells for example.

The techniques can be used for detecting different types of short circuit scenarios. In one scenario, a NAND string has a word line-to-channel short circuit but not a bit line contact-to-bit line contact short circuit. In another scenario, a NAND string has both a word line-to-channel short circuit and a bit line contact-to-bit line contact short circuit.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control circuit 115. A storage region 113 may be provided, e.g., for operational parameters and software/code. In one embodiment, the state machine 112 is programmable by the software. In other embodiments, the state machine 112 does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowchart discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in three dimensions.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory array may be arranged as multiple vertical columns (e.g., columns extending substantially perpendicular to the major surface of the substrate, i.e., in the y direction) with each column having multiple memory elements. Other configurations of memory elements in three dimensions can also constitute a 3D memory array.

In a 3D NAND memory array, the memory elements may be coupled together to form a vertical NAND string that traverses across multiple horizontal memory device levels.

Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The control circuit may be configured to issue one or more commands via the memory interface to perform an operation which distinguishes short circuited NAND strings from non-short circuited NAND string. These commands can involve performing the steps of the flowchart discussed further below, and provide the voltage waveforms discussed further below.

The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

The term "memory die" can refer to a semiconductor die that contains non-volatile memory cells for storage of data.

The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits SC0-SC3 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

SC0 can operate during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

SC0 can also operate during a verify test in a program loop to sense a memory cell to determine whether it has completed programming by reaching an assigned data state, e.g., as indicated by its Vth exceeding the verify voltage of the assigned data state. SC0 can also operate during a read operation to determine the data state to which a memory cell has been programmed. SC0 can also operate in an erase operation during a verify test to determine whether a plurality of memory cells have a Vth below a verify voltage. The sense circuit can perform sensing by determining whether a conduction current in a connected bit line is above or below a predetermined threshold level. This indicates whether the Vth of the memory cell is below or above, respectively, the word line voltage.

Figure 10:
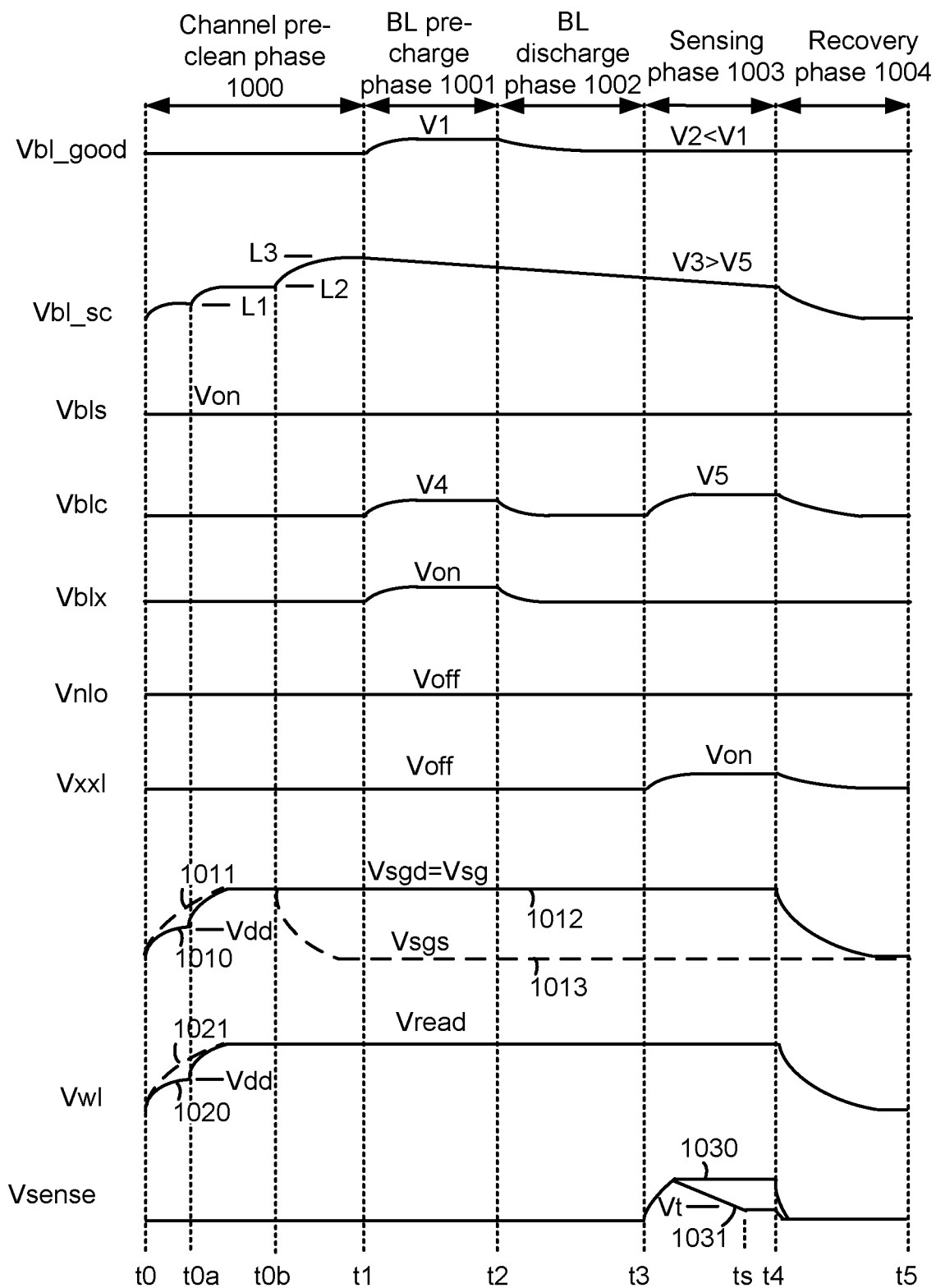
FIG. 10 depicts voltage signals consistent with FIGS. 8 and 9A to 9H.

A sense circuit can also operate in a short circuit detection operation as described at the outset. In one approach, a sense circuit determines a level of a current in a NAND string in a selected sub-block of a block. In another approach, a sense circuit determines a level of a current which flows collectively in multiple NAND strings—one NAND string from each sub-block of a block, where the NAND strings are connected to a common bit line. A NAND string having a current below a threshold is considered to be in a programmed or non-conductive state, and a NAND string having a current above the threshold is considered to be in an erased or conductive state. For example, as depicted in FIG. 10, a voltage of the sense node 171, Vsense, can be monitored in a sensing phase of the operation to determine whether it falls below a threshold Vt at a sense time ts.

Each sense circuit is connected to a respective bit line via a set of transistors. Each bit line in turn is connected to NAND strings in one or more blocks. In one approach, each NAND string is also connected to multiple NAND strings in a block, e.g., one NAND string in each sub-block of a block. For example, SC0 is connected to BL0 via a set of transistors 250 and BL0 is connected to the NAND string 700n. The set of transistors 250 could also be considered to be part of the sense circuit. The set of transistors includes an XXL transistor 252 which is turned on (set in a conductive state) to allow sensing to occur, by providing a conductive path between the bit line BL0 and the sense circuit SC0, assuming the BLC transistor 255 and the BLS transistor 256 are also turned on. A power supply node 251 receives a voltage which can be connected to the bit line via a BLX transistor 253 to charge up the bit line, assuming the BLC transistor 255 and the BLS transistor 256 are also turned on. A NLO transistor 254 provides a connection to ground. The BLC transistor is a bit line clamp transistor which is configured to clamp a voltage of the bit line, in some configurations. The BLS transistor is a sensing transistor which is turned on throughout a short circuit detection operation as described herein and during other sensing operations. The transistors can be nMOSFETs, for example.

Generally, the BLC transistor 255 has a control gate 58, a drain 57 and a source 59, and can operate as a pass gate or as a bit line clamp. When the voltage at the control gate is sufficiently higher than the voltage on the drain, the transistor operates as a pass gate to pass the voltage at the drain to the bit line at the source 59 of the transistor. When the voltage at the control gate is lower than the voltage on the drain, the BLC transistor operates as a source-follower to set or clamp the bit line voltage at Vcg-Vth, where Vcg is the voltage on the control gate 58 and Vth, e.g., 1 V, is the threshold voltage of the transistor. This assumes the source line is at 0 V.

SC0 can connect to the drain 57 of the BLC transistor when the XXL transistor is turned on. During sensing, the sense node 171 is charged up to an initial voltage such as 3 V. The sense node is then connected to the bit line via the XXL, BLC and BLS transistors, and an amount of decay of the sense node is used to determine whether a memory cell or NAND string is in a conductive or non-conductive state. In particular, the comparison circuit 175 determines the amount of decay by comparing the sense node voltage to a threshold Vt at a sense time. See the example sense time is in FIG. 10. If the sense node voltage decays below Vt, the memory cell or NAND string is in a conductive state and its Vth is considered to be at or below the word line voltage. If the sense node voltage does not decay below Vt, the memory cell or NAND string is in a non-conductive state and its Vth is considered to be above the word line voltage. A sense node latch 172 is set to 1 or 0, for example, by the comparison circuit 175 based on whether the memory cell is in a conductive (erased) or non-conductive (programmed) state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits SC0-SC3, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit SC0. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
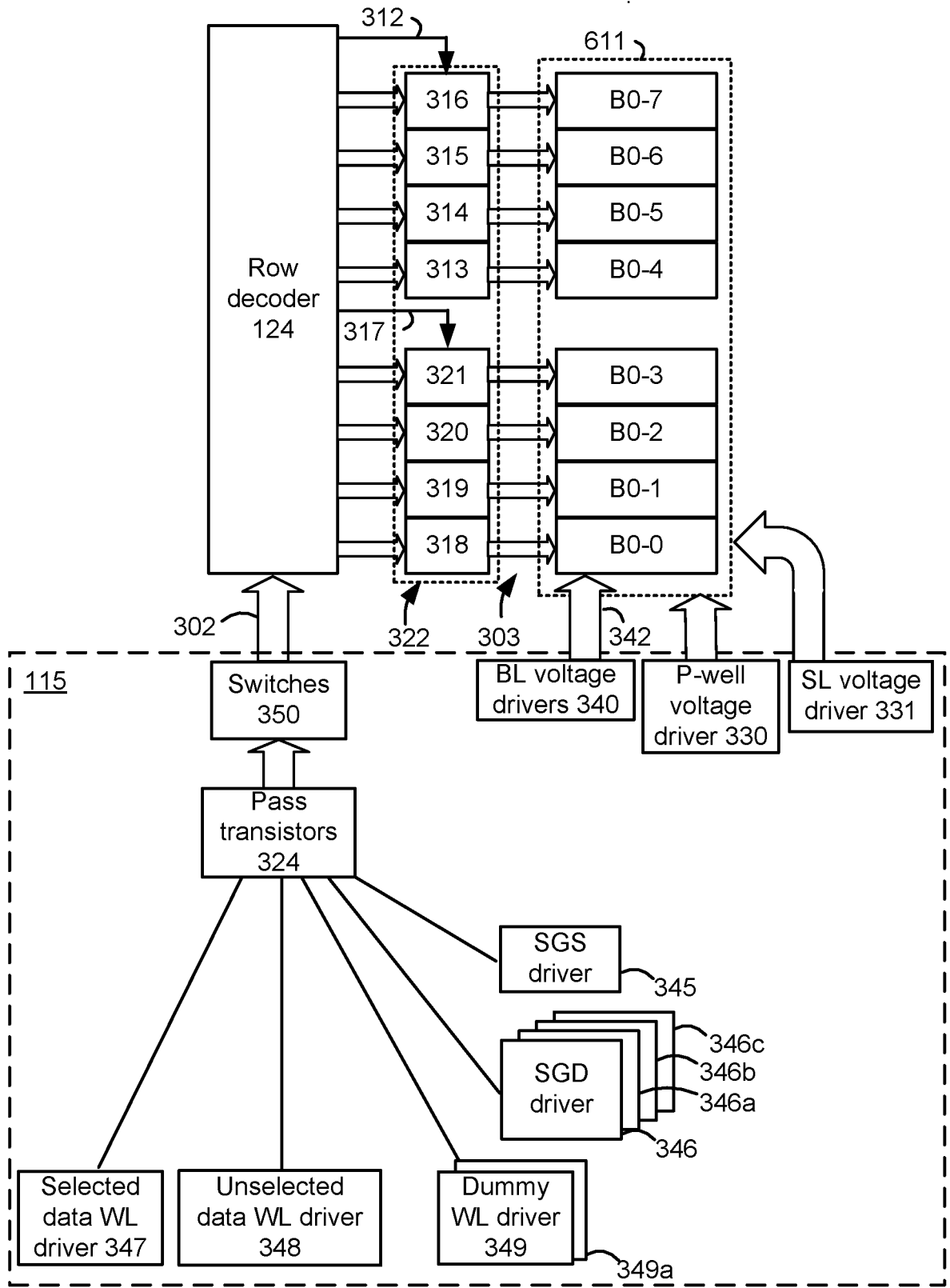
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 4. The blocks can be in one or more planes. The row decoder 124 of FIG. 1A provides voltages to word lines and select gate control lines of each block via pass transistors 322. In one approach, a separate row decoder is provided for each block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6.

The voltage drivers can also include separate SGD drivers for each sub-block. For example, SGD drivers 346, 346a, 346b and 346c can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 612b in the p-well region 611b, e.g., via the conductive path 682. See FIG. 6. In one approach, the p-well region 611b is common to the blocks. Vp-well can be the same as Verase in FIGS. 12 and 13. A set of bit lines 342 is also shared by the blocks. The source line (SL) voltage driver 331 provides a voltage Vsl to the n+contact 612c in the p-well region 611b, e.g., via the local interconnect 651.

Bit line voltage drivers 340 include voltage sources which provide voltages to the bit lines 342. The bit line voltage for sensing in an erase verify test can be 0.5 V, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
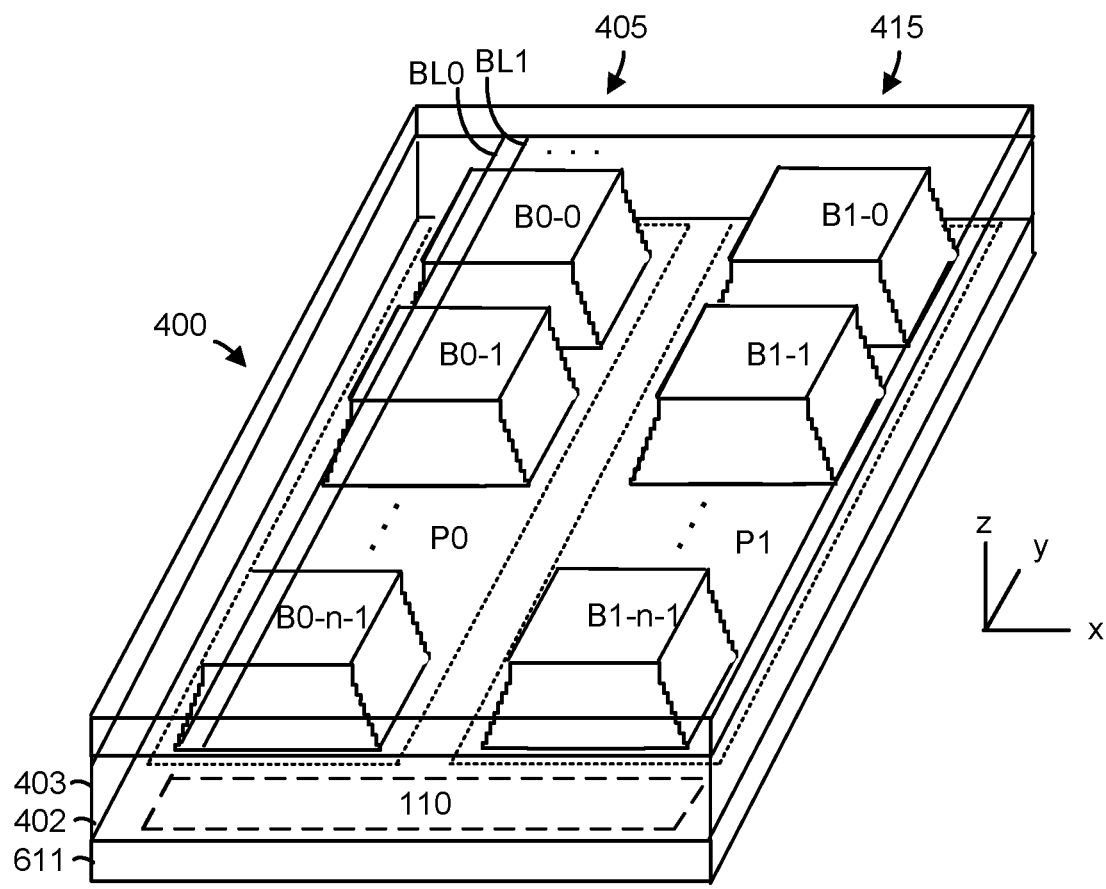
FIG. 4 is a perspective view of an example memory die 400 in which blocks of memory cells are provided in respective planes P0 and P1.

FIG. 4 is a perspective view of an example memory die 400 in which a plurality of blocks of memory cells are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. For example, a common set of bit lines BL0, BL1 . . . extends over the blocks B0-0 to B0-$n$-1 of the plane P0. Another set of bit lines can extend over the blocks B1-0 to B1-$n$-1 of the plane P1. Planes P0 and P1 represent respective isolation regions which are formed in the substrate 611. Further, a first block sequence 405 of a number n blocks, labelled B0-0 to B0-$n$-1, are formed in P0, and a second block sequence 415 of a number n blocks, labelled B1-0 to B1-$n$-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 611 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

The plurality of blocks typically include user data blocks and one or more read-only memory (ROM) blocks, e.g., User ROM blocks. The user data blocks are available for repeated program, read and erase operations during the lifetime of the memory device. These blocks typically store user data which is provided by the host. A ROM block, also referred to as a user ROM block, typically maintains the same data over the lifetime of the memory device and is not altered, as mentioned at the outset. The data in the User ROM block can include data identifying bad (defective) columns or bad blocks among the user data blocks, for instance. The data in the User ROM block can include parameters for configuring the memory device after a power up. The one or more User ROM blocks are tested at the time of manufacture to ensure they are not defective.

When the memory device is powered on, the bad column data is read in by a controller and used to provide a column replacement table for use during read and write operations. In some cases, to increase reliability, the ROM block stores data using one bit per cell. The user data blocks can store data with a higher density using two or more bits per cell.

For example, B1-0 may be a User ROM block while the remaining blocks B0-0 to B0-*n*-1 and B1-1 to B1-*n*-1 are user data blocks.

Figure 5:
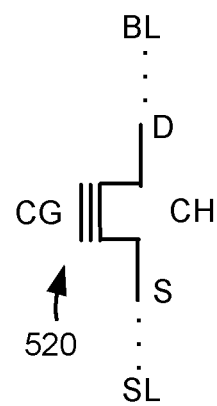
FIG. 5 depicts an example transistor 520 in the memory structure 126 of FIG. 1A.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string. The transistor can represent a memory cell or a select gate transistor, for example.

FIG. 6 depicts an example cross-sectional view of a portion of the block B0-0 of FIG. 4, including NAND strings 700*n* and 710*n* which, in this example, are in a common sub-block. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include multiple tiers of alternating conductive and dielectric layers, where the tiers are separated by an interface. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. The use of dummy memory cells is optional. WL0-WL95 are data word lines connected to data memory cells, which are eligible to store user data. As an example only, the stack includes ninety-six data word lines. DL is an example dielectric layer.

A top 610*t* and bottom 610*b* of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, and a source-side select gate transistor 701 is formed where the SGS control line intersects with the multiple thin layers. A topmost data memory cell 714 is formed where WL95 intersects with the multiple thin layers, and a bottommost data memory cell 703 is formed where WL0 intersects with the multiple thin layers.

The multiple thin layers can form annular layers and can be deposited, e.g., using atomic layer deposition. For example, the layers can include a blocking oxide layer 663, a charge-trapping layer 664, a tunneling layer 665, and a channel layer 660. A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 612 connected to the source ends of the NAND strings. The p-well region may comprise epitaxial regions 612*a* which extend upward adjacent to the source-side select gate transistors. The p-well region can include an n+contact 612*c* connected to a local interconnect 651 for receiving a source line voltage, and a p+ contact 612*b* connected to a conductive path 682 for receiving a p-well voltage. The local interconnect 651 can comprise a conductive material 651*b* such as metal surrounded by insulating material 651*a* to prevent conduction with the metal of the adjacent word lines. The p-well region is formed in an n-well 613, which in turn is formed in a p-type semiconductor region 614 of the substrate, in one possible implementation.

The NAND string 700*n* has a source end 700*s* at a bottom 610*b* of the stack 610, connected to the p-well. The NAND string 700*n* also has a drain end 700*d* at a top 610*t* of the stack, connected to a bit line BL0 via a bit line contact 680 comprising an n-type material. The NAND strings 710*n* and 710*n* are connected to BL0 and BL1, respectively, via bit line contacts 680 and 681, respectively. A short circuit path 685 is present between WL95 and the channel layer 660. This is an example of a word line-to-channel short circuit. WL95 is an example of a leaky word line. A short circuit path 684 is also present between the bit line contacts 680 and 681, in a doped silicon region 683 above the NAND strings. This is a bit line contact-to-bit line contact short circuit, or a bit line-to-bit line short circuit. Additional examples of short circuits are provided in FIG. 7C-7G.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the injection of holes into the charge trapping layer.

Figure 7A:
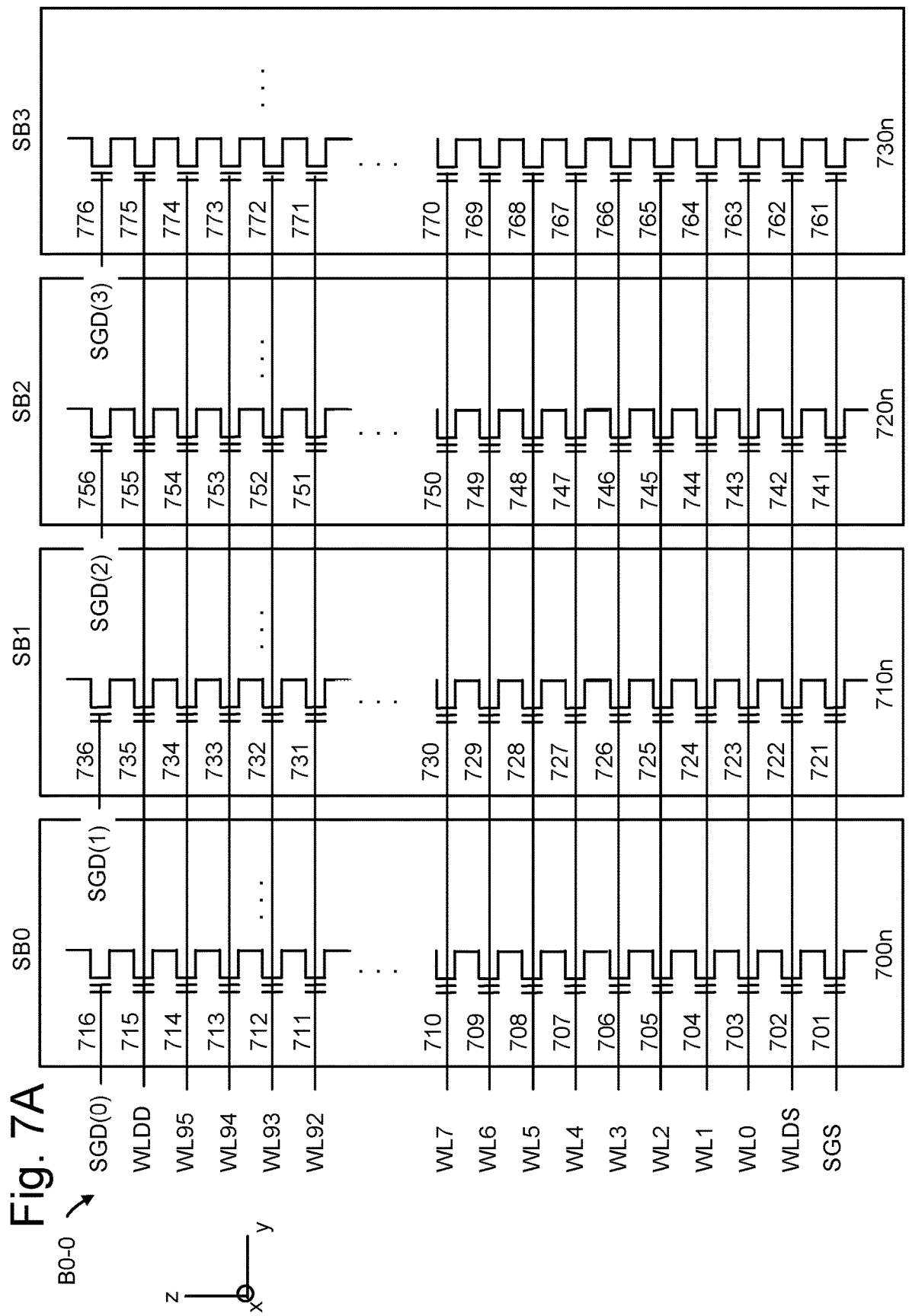
FIG. 7A depicts an example view of NAND strings in the block B0-0 which is consistent with FIGS. 4 and 6.

FIG. 7A depicts an example view of NAND strings in the block B0-0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 6. Each sub-block comprises a set of NAND strings which extend in the x direction and which have a common SGD line or control gate layer. The NAND strings 700*n*, 710*n*, 720*n* and 730*n* are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible such as by erasing a selected sub-block of the block and/or by erasing memory cells connected to a subset of the word lines which is fewer than all of the word lines.

The plurality of memory cells of B0-0 are arranged in NAND strings, where each NAND string comprising a continuous charge trapping layer along a length of the NAND string. NAND string 700*n* includes SGS transistor 701, dummy memory cell 702, data memory cells 703-714, dummy memory cell 715 and SGD transistor 716. NAND string 710*n* includes SGS transistor 721, dummy memory cell 722, data memory cells 723-734, dummy memory cell 735 and SGD transistor 736. NAND string 720*n* includes SGS transistor 741, dummy memory cell 742, data memory cells 743-754, dummy memory cell 755 and SGD transistor 756. NAND string 730*n* includes SGS transistor 761, dummy memory cell 762, data memory cells 763-774, dummy memory cell 775 and SGD transistor 776.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 7B:
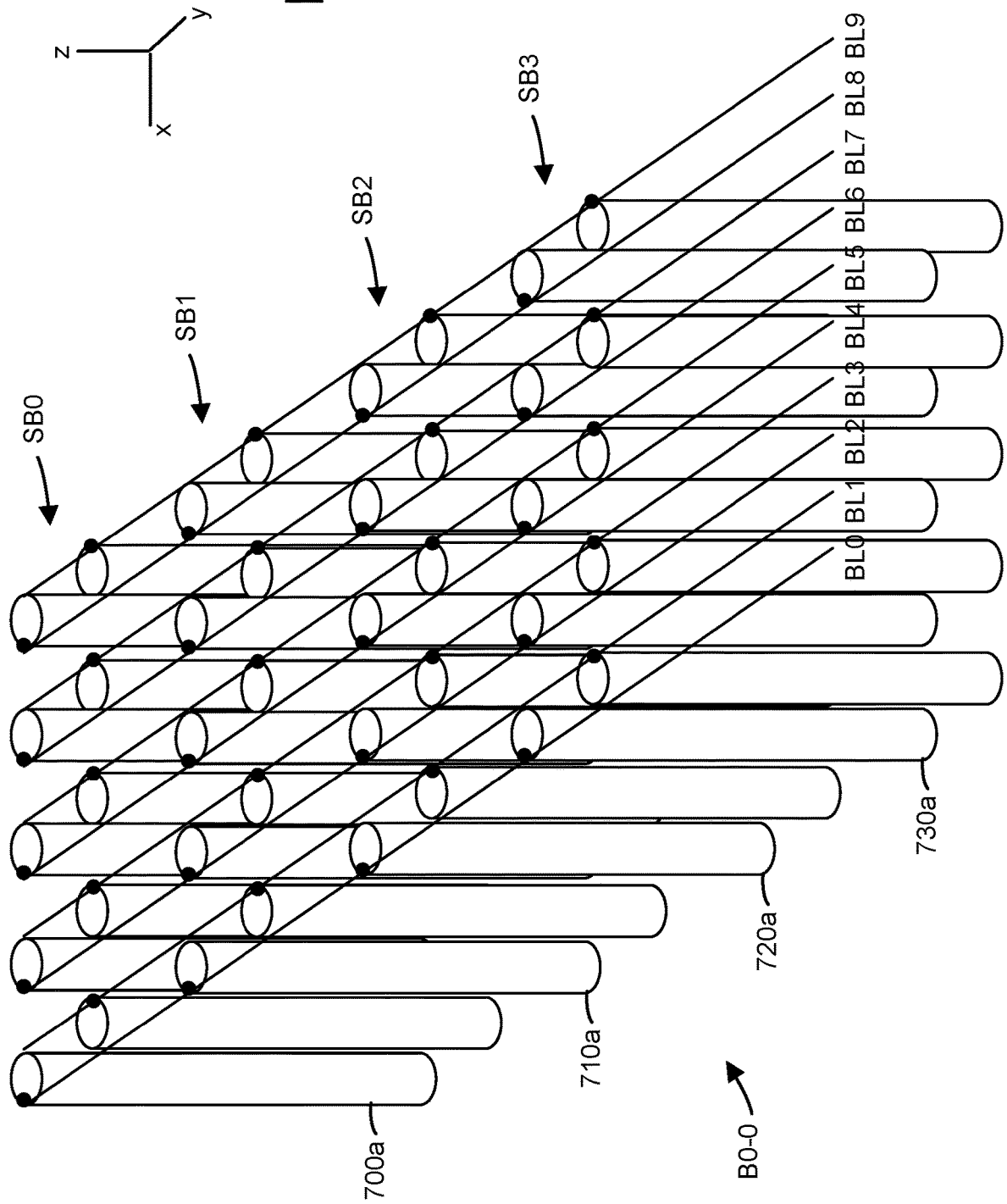
FIG. 7B depicts an example view of NAND strings in the block B0-0 of FIG. 7A.

FIG. 7B depicts an example view of NAND strings in the block B0-0 of FIG. 7A. Each NAND string is represented by a pillar. In this simplified example, sub-blocks SB0-SB3 each include ten example NAND strings connected to respective bit lines BL0-BL9. A black circle represents a connection point of a NAND string to a bit line. The NAND strings 700*a*, 710*a*, 720*a* and 730*a* of FIG. 7A are depicted. Recall from FIG. 4 that the set of bit lines can extend above multiple blocks of memory cells.

FIG. 7C depicts an example of a first failure mode consistent with FIG. 7B, where in SB0, a NAND string 700*b* has a word line-to-channel short circuit path 801, and a cluster of NAND strings 800 comprising NAND strings 700*b*-700*d* are short circuited to one another. For simplicity, the NAND strings of SB1-SB3 are not depicted. The cluster includes three NAND strings as an example which are connected to three different respective bit lines, BL1-BL3. The cluster is contained in one sub-block.

In FIG. 7C to 7F, short circuited NAND strings are shown in a shaded pattern, while the remaining, non-short circuited NAND strings are unshaded. A short circuit between NAND strings may be a bit line contact-to-bit line contact short circuit, for example.

Figure 7D:
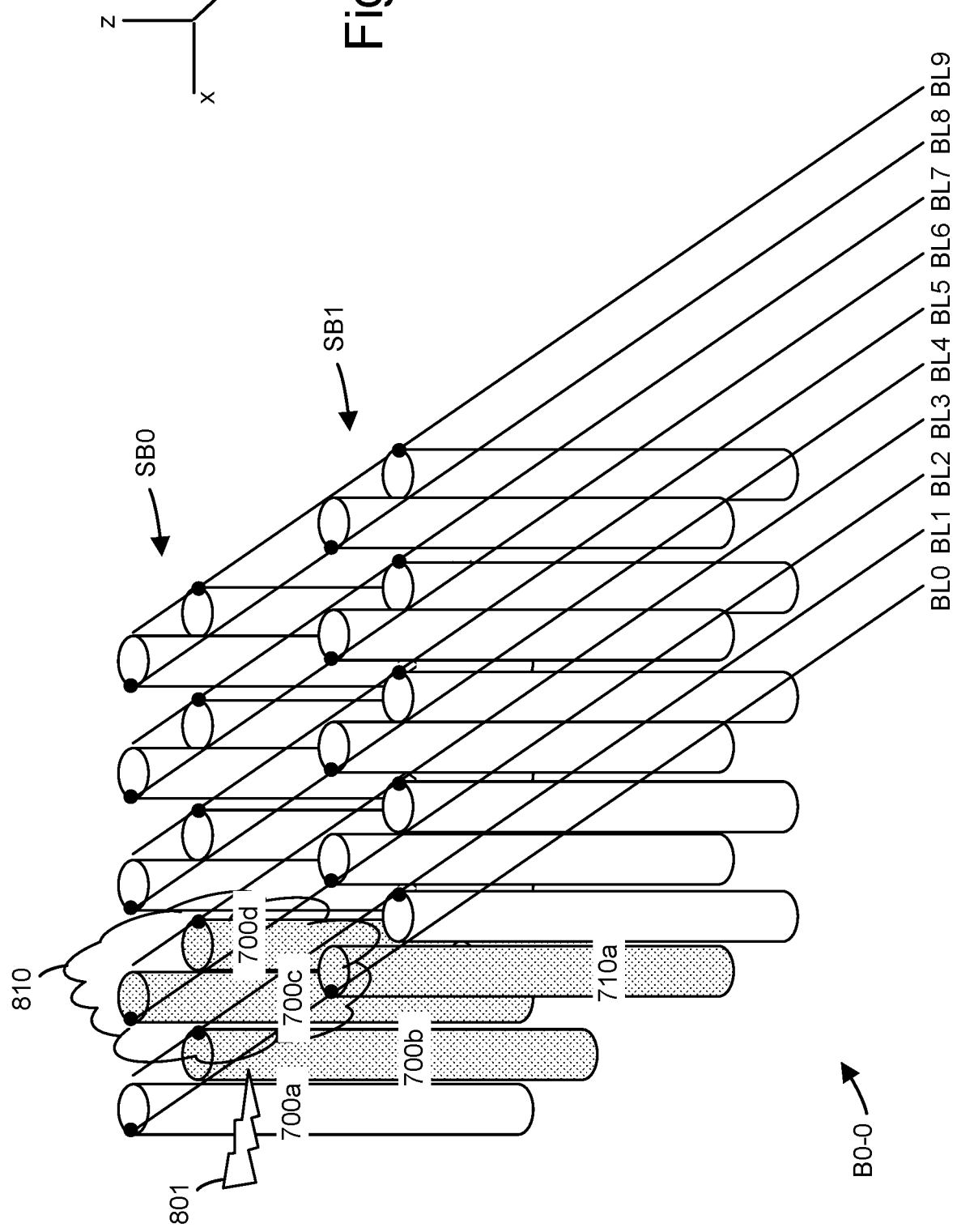
FIG. 7D depicts an example of a second failure mode consistent with FIG. 7B, where in SB0, a NAND string 700b has a word line-to-channel short circuit path 801, and a cluster of NAND strings 810 comprising NAND strings 700b-700d in SB0 and NAND string 710a in SB1 are short circuited to one another.

FIG. 7D depicts an example of a second failure mode consistent with FIG. 7B, where in SB0, a NAND string 700*b* has a word line-to-channel short circuit path 801, and a cluster of NAND strings 810 comprising NAND strings 700*b*-700*d* in SB0 and NAND string 710*a* in SB1 are short circuited to one another. For simplicity, the NAND strings of SB2 and SB3 are not depicted. The cluster includes four NAND strings as an example which are connected to four different respective bit lines, BL0-BL3. The cluster extends across two, adjacent sub-blocks of a block.

FIG. 7E depicts an example of a third failure mode consistent with FIGS. 4 and 7B, where in SB3 of B0-0, a NAND string 730*b* has a word line-to-channel short circuit path 831, and a cluster of NAND strings 819 comprising NAND strings 730*b*-730*d* in SB3 and NAND string 740 in SB0 of an adjacent block B0-1 are short circuited to one another. For simplicity, the NAND strings of the remaining sub-blocks of the two blocks are not depicted. The cluster includes four NAND strings as an example which are connected to four different respective bit lines, BL0-BL3. The cluster extends across two, adjacent sub-blocks of adjacent blocks B0-0 and B0-1, consistent with FIG. 4.

FIG. 7F depicts an example of a fourth failure mode consistent with FIG. 7B, where in SB0, a NAND string 700*a* has a word line-to-channel short circuit path 802, and a cluster of NAND strings 810 comprising NAND strings 700*b*-700*d* in SB0 and NAND string 710*a* in SB1 are short circuited to one another. For simplicity, the NAND strings of SB2 and SB3 are not depicted. The cluster includes four NAND strings as an example which are connected to four different respective bit lines, BL0-BL3. The cluster extends across two, adjacent sub-blocks of a block. Moreover, the word line-to-channel short circuit path 802 is in a NAND string 700*a* which is not also short circuited to another NAND string, contrary to the examples of FIG. 7C to 7E.

FIG. 7G depicts an example of a fifth failure mode consistent with FIG. 7B, where in SB0, a NAND string 700*a* has a word line-to-channel short circuit path 802, and no NAND strings are short circuited to one another. In this example, the short circuit only involves the NAND string 700a.

FIG. 8 depicts a flowchart of an example process for performing a short circuit detection operation, consistent with the failure scenarios of FIG. 7C to 7G. At step 820, a command is issued to begin a short circuit detection operation for a plurality of NAND strings, such as in a block or sub-block. For example, the control circuit 130 of FIG. 1B can issue such a command via the interface 131. The memory cells can be in the erased state, for example.

Figure 9A:
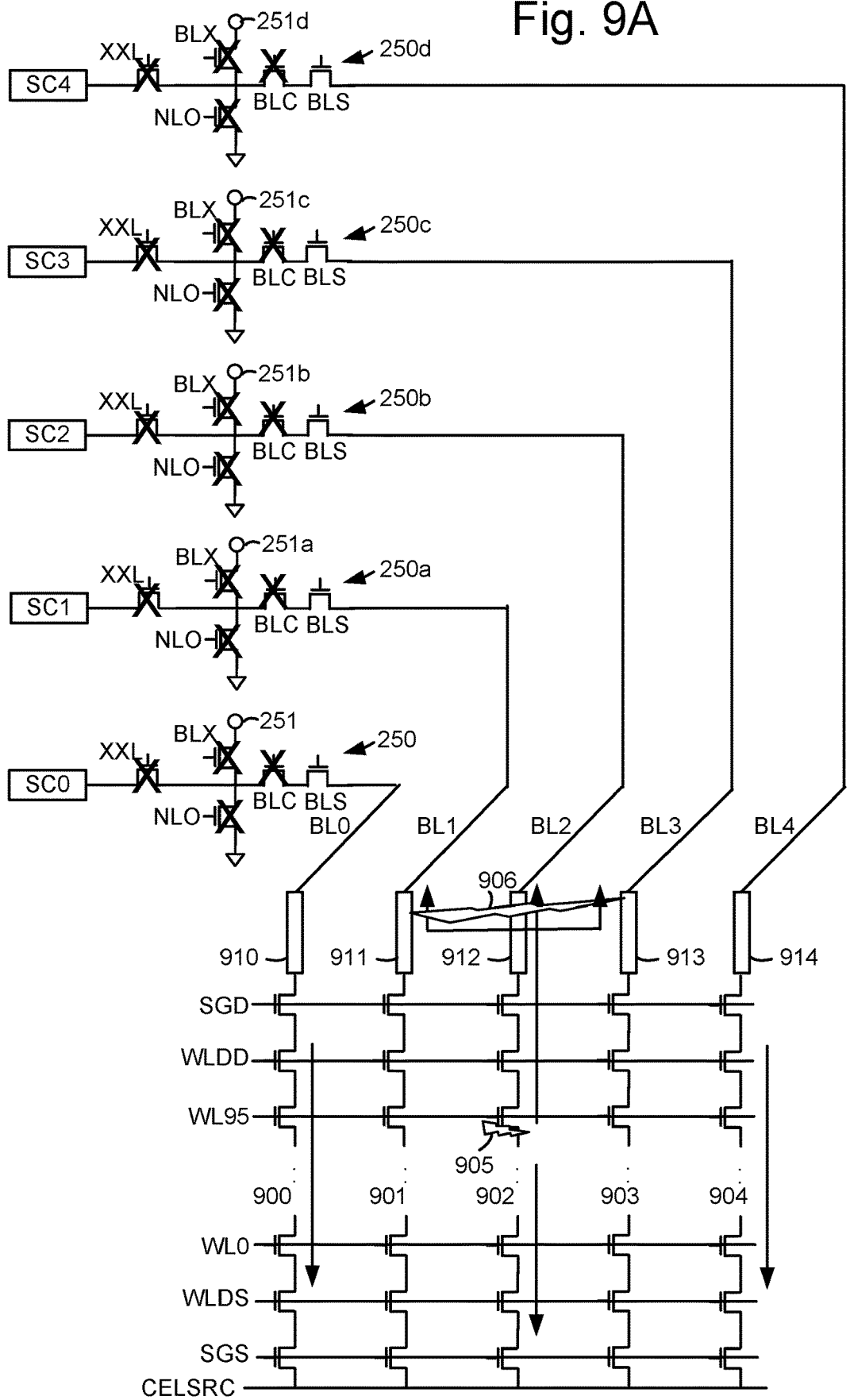
FIG. 9A depicts a set of NAND strings and associated circuitry in a configuration which is consistent with the channel pre-clean phase of FIG. 8, step 821, when there is a word line-to-memory hole short circuit and a bit line contact-to-bit line contact short circuit.

Step 821 includes performing a channel pre-clean phase of the operation. In this phase, sense circuits and associated sets of transistors can be configured as depicted in FIG. 9A. The presence of a word line-to-channel short circuit in the NAND string 902 allows a positive voltage on WL95 to charge up the channel of this NAND string. The charge on the channel is conveyed to the bit line contact 912 and to the bit line BL2. Further, the presence of a short circuit path 906 between the bit line contacts 911-913 in this example results in an increase of the voltages on BL1 and BL3. This process of charging up the bit lines is referred to as reverse charging because the NAND string is the source of the charging rather than the nodes 251-251d and the sets of transistors 250-250d. The reverse charging is represented by the upward arrows. The NAND strings 901-903 comprise a cluster of short circuited NAND strings.

The NAND strings 900 and 904 do not have a short circuit and are therefore not charged up during this phase. Instead, the channels of these NAND strings are discharged when the SGS transistors are turned on and the CELSRC line (source line) is at ground. The discharge to CELSRC is represented by the downward arrows in the NAND strings 900 and 904. Some discharge to CELSRC in the NAND string 902 also occurs as represented by the respective downward arrow.

Figure 9B:
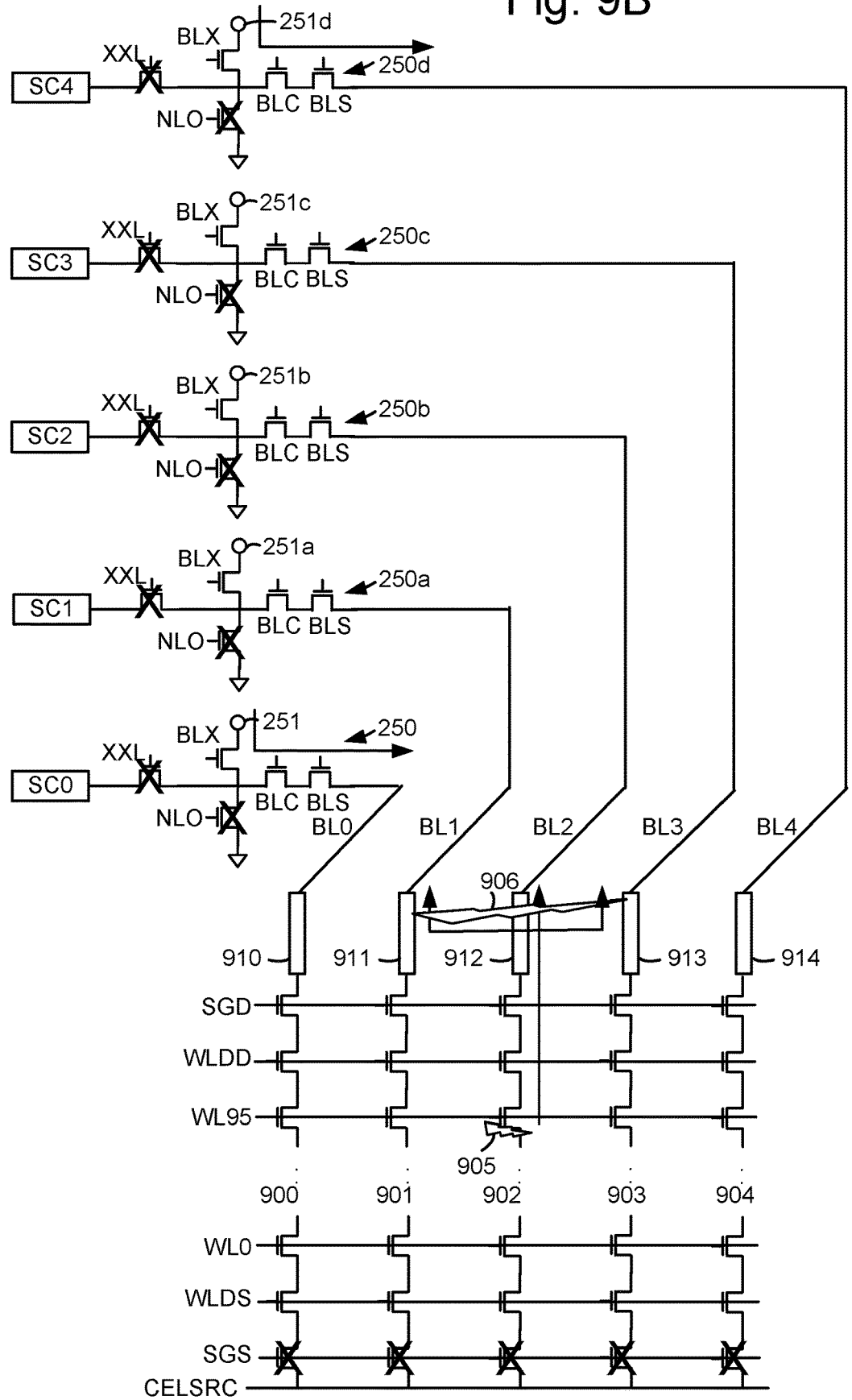
FIG. 9B depicts a set of NAND strings and associated circuitry in a configuration which is consistent with the bit line pre-charge phase of FIG. 8, step 822, and which follows the configuration of FIG. 9A.

Step 822 includes performing a bit line pre-charge phase of the operation. In this phase, the sense circuits and associated sets of transistors can be configured as depicted in FIG. 9B to supply a voltage to the bit lines. The sets of transistors 250-250d are configured to charge up the bit lines. This configuration for the sets of transistors 250 and 250d does result in charging up BL0 and BL4, respectively, since they are connected to the non-short circuited NAND strings 900 and 904, respectively. However, the bit lines BL1-BL3 continue to be reverse charged. The reverse charge is greater than the charge applied by the sets of transistors 250a-250c, so that the reverse charge is maintained.

Figure 9C:
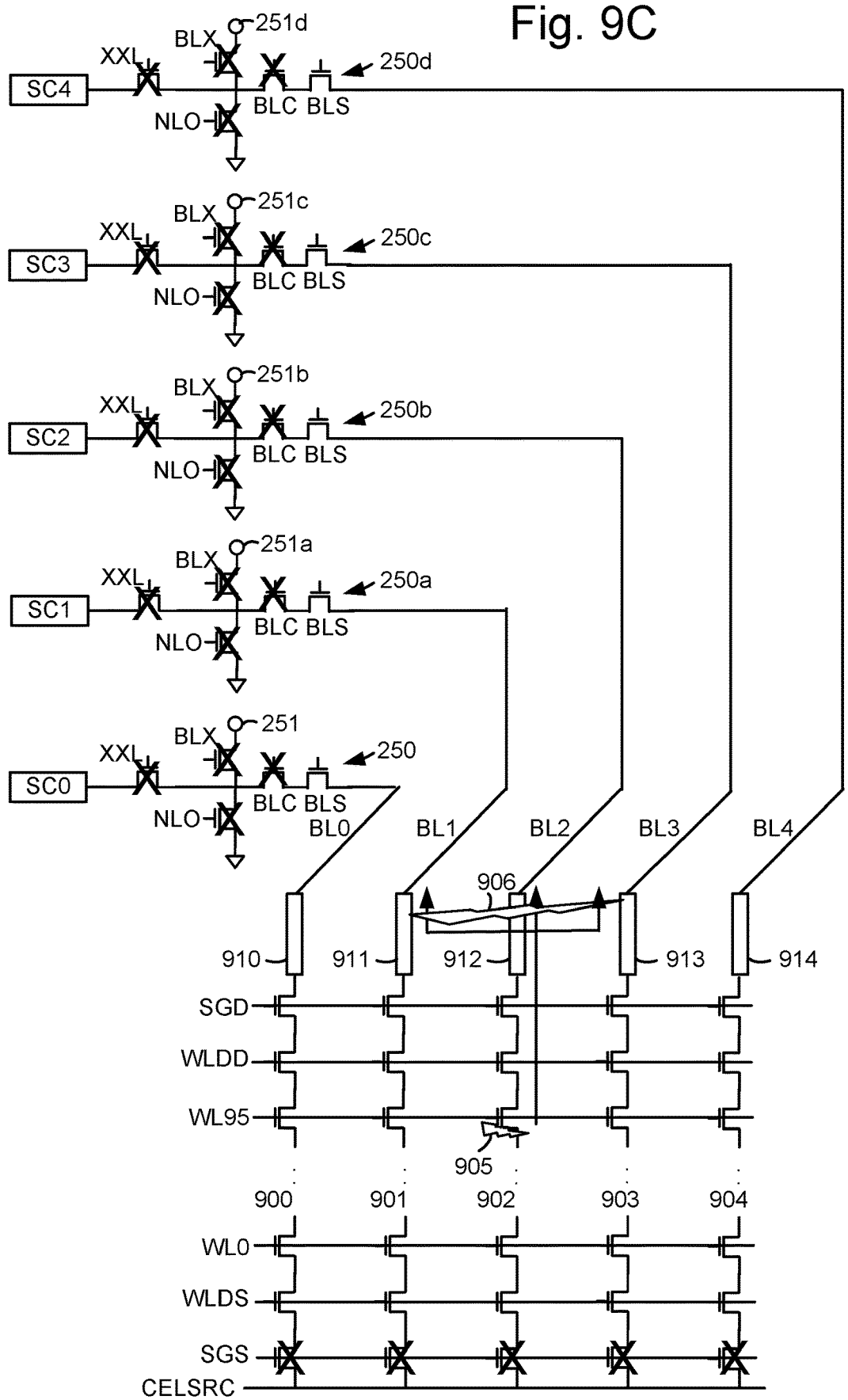
FIG. 9C depicts a set of NAND strings and associated circuitry in a configuration which is consistent with the bit line discharge phase of FIG. 8, step 823, and which follows the configuration of FIG. 9B.

Step 823 includes performing a bit line discharge phase of the operation. In this phase, the sense circuits and associated sets of transistors can be configured as depicted in FIG. 9C to stop supplying a voltage to the bit lines. The bit lines BL1-BL3 continue to be reverse charged, while the voltage on BL0 and BL4 discharges.

Figure 9D:
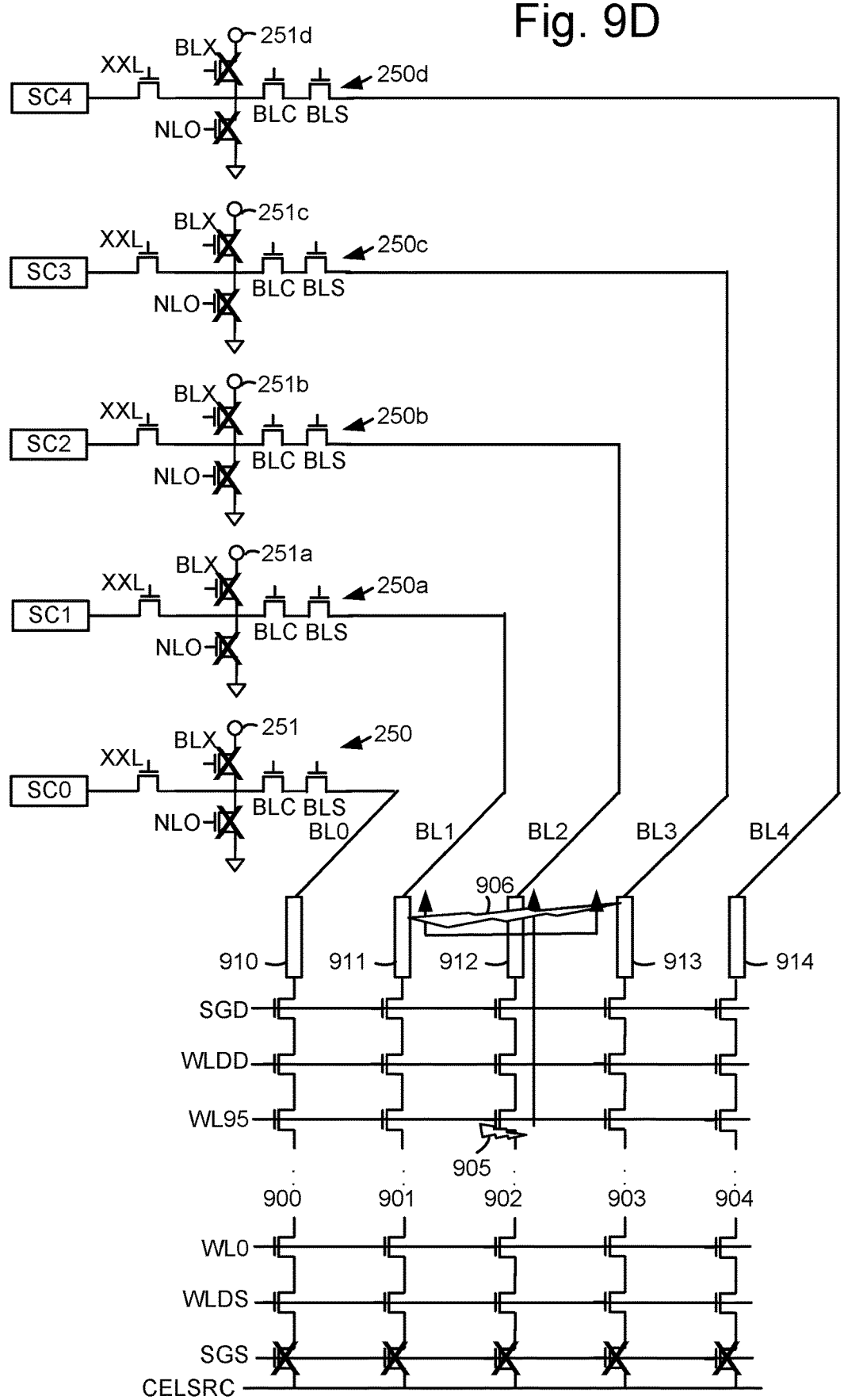
FIG. 9D depicts a set of NAND strings and associated circuitry in a configuration which is consistent with the sensing phase of FIG. 8, step 824, and which follows the configuration of FIG. 9C.

Step 824 includes performing a sensing phase of the operation to distinguish short circuited NAND strings from non-short circuited NAND strings. In this phase, the sense circuits and associated sets of transistors can be configured as depicted in FIG. 9D to sense the NAND strings. The XXL, BLC and BLS transistors are turned on to provide a path from the bit lines to the respective sense circuits. Each sense circuit can detect a current and/or voltage in a respective NAND string based on an amount of voltage decay of a sense node, for example, as discussed. See also Vsense in FIG. 10. The bit lines BL1-BL3 continue to be reverse charged, while the voltage on BL0 and BL4 remains at a lower, discharged level. As mentioned in connection with FIG. 2, a comparison circuit 175 can determine the amount of decay of the sense node by comparing the sense node voltage to a threshold Vt at a sense time. If there is no reverse charging, as is expected for a non-short circuited NAND string (such as NAND strings 900 and 904), the sense node voltage will decay below Vt. In this case, the NAND string has a relatively high current and is in a conductive state. If the bit line is reverse charged, as is expected for a short circuited NAND string (such as NAND strings 901-903), the sense node voltage will not decay below Vt. In this case, the NAND string has a relatively low current and is in a non-conductive state.

Step 825 includes setting data in latches to identify short circuited and non-short circuited NAND strings, based on the sensing. For example, or each bit line and NAND string, a respective sense node latch 172 can be set to 1 or 0, for example, by the comparison circuit 175 based on whether the memory cell is in a conductive or non-conductive state, respectively. This identifies each NAND string as being short circuited or non-short circuited.

Step 826 includes obtaining a count of the short circuited NAND strings. For example, this can involve a control circuit reading the latches to determine a number of latches set to 0, indicating a non-conductive NAND string.

A decision step 827 determines if the count is greater than a threshold of an allowable number of short circuited NAND strings in a block or other group. If the decision step is true (T), the block or other group of NAND strings is leaky at step 829 and may therefore be unusable. If the decision step is false (F), the block or other group of NAND strings is normal at step 828 and is therefore usable, such as for storing user data. Generally, a control circuit is configured to count a number of NAND strings among the plurality of NAND strings which are in a non-conductive state according to the sensing and determine whether the number exceeds a threshold. Further, the control circuit is configured to classify the plurality of NAND strings as being unusable if the number exceeds a threshold.

The testing process of FIG. 8 may occur at a manufacturing site before releasing the block to the end user, in one approach. In another approach, the testing process occurs periodically, such as when a block reaches specified program-erase cycles. This approach can detect problems in a block which is initially normal but develops a short circuit due to the stress of the program-erase cycles.

Step 830 includes performing a recovery phase of the operation, after the sensing phase. The recovery phase returns the voltages of the various control lines such as word lines, select gate lines and bit lines to an initial level, e.g., 0 V.

The short circuit detection process can advantageously sense all bit lines/NAND strings concurrently to effectively detect clusters of short circuits. The technique can distinguish between a NAND string which is unopened at the bottom and a NAND string with a word line-to-channel short circuit. The techniques are particularly suitable when a cluster of NAND strings have their bit line contacts short circuited to one another.

The pre-charge and discharge phases help identify bit lines which can discharge and are therefore not subject to reverse charging from a short circuit.

FIG. 9A to 9H each depict a set of NAND strings 900-904 connected to bit line contacts 910-914, respectively, which in turn are connected to bit lines BL0-BL4, respectively. The NAND strings comprise data memory cells connected to word lines WL0-WL95, dummy memory cells connected to word lines WLDS and WLDD, and a source end select gate transistor and a drain end select gate transistor connected to select gate lines SGS and SGD, respectively, consistent with FIGS. 6 and 7A.

FIG. 9A to 9H also depict a sense circuit and a set of transistors connected to each bit line. For example, the sense circuit SC0 and a set of transistors 250 are connected to BL0, the sense circuit SC1 and a set of transistors 250a are connected to BL1, the sense circuit SC2 and a set of transistors 250b are connected to BL2, the sense circuit SC3 and a set of transistors 250c are connected to BL3, and the sense circuit SC4 and a set of transistors 250d are connected to BL0. The transistors are nMOSFETs in this example. A transistor with an "X" is non-conductive or turned off, while a transistor without an "X" is conductive or turned on. The sets of transistors 250-250d each include a power supply node 251-251d, respectively. Refer also to FIG. 10 for corresponding voltages signals during the short circuit detection operation of FIG. 8.

FIG. 9A to 9D depict an example of a word line-to-memory hole short circuit and a bit line contact-to-bit line contact short circuit for the NAND string 902, consistent with FIG. 7C to 7E. In particular, the NAND string 902 has a word line-to-channel short circuit path 905 at WL95. Additionally, there is a short circuit between the bit line contacts 911 and 912, and between the bit line contacts 912 and 913. These two short circuit form a continuous short circuit path 906 among the bit line contacts 911-913. This is an example, as this type of short circuit can involve two or more bit line contacts, which are typically adjacent to one another.

In one implementation consistent with FIG. 9A to 9D, a control circuit is configured to connect to a plurality of NAND strings (900-904), the plurality of NAND strings are connected to a plurality of word lines (WL0-WL95) and comprise a first short circuited NAND string (902) which is short circuited to a leaky word line (WL95) of the plurality of word lines, a second short circuited NAND string (901 or 903) which is short circuited to the first short circuited NAND string, and non-short circuited NAND strings (900 and 904), which are not short circuited to another NAND string. Each NAND string is connected to a respective bit line of a plurality of bit lines (BL0-BL4).

In another implementation consistent with FIG. 9A to 9D, a plurality of NAND strings comprise one short circuited NAND string (902) and another short circuited NAND string (901 or 903), where the one short circuited NAND string comprises a channel short circuited to a word line (WL95) and a bit line contact (912) short circuited to a bit line contact (911 or 913) of the another short circuited NAND string. The bit line contact of the one short circuited NAND string can be short circuited to the bit line contact of the another short circuited NAND string via a doped silicon region (1145a, FIG. 11H) extending from the bit line contact of the one short circuited NAND string to the bit line contact of the another short circuited NAND string.

In FIG. 9A to 9D, voltages of bit lines connected to the one short circuited NAND string (BL2) and the another short circuited NAND string (BL1 or BL3) are higher than voltages of non-short circuited NAND strings of the plurality of NAND strings during the sensing phase 1003 (FIG. 10), and the non-short circuited NAND strings (900 and 904) comprise NAND strings which are not short circuited to another NAND string.

Voltages of bit lines (BL0 and BL4) connected to the non-short circuited NAND strings of the plurality of NAND strings are boosted in the second, bit line pre-charge phase and discharged in the third, bit line discharge phase; voltages of bit lines connected to the one short circuited NAND string (BL2) and the another short circuited NAND string (BL1 and BL3) are higher than voltages of the non-short circuited NAND strings throughout the second phase and the third phase; and the non-short circuited NAND strings comprise NAND strings which are not short circuited to another NAND string.

FIG. 9A depicts a set of NAND strings and associated circuitry in a configuration which is consistent with the channel pre-clean phase of FIG. 8, step 821, when there is a word line-to-memory hole short circuit and a bit line contact-to-bit line contact short circuit. The transistors in the sets of transistors are turned off, except BLS may be turned on in preparation for subsequent phases of the operation. A positive voltage on WL95 is leaked to the channel of the NAND string 902. The voltage passes to the bit line contact 912 and from there to BL2, and the bit line contacts 911 and 913. The voltage on the bit line contacts 911 and 913 passes to BL1 and BL3, respectively. BL1-BL3 therefore have an elevated voltage as depicted by Vbl_sc in FIG. 10 in the channel pre-clean phase 1000. For the non-short circuited NAND strings 900 and 904, the word line voltage does not leak to the channel. This allows their channels to be grounded at the CELSRC as the SGS transistors are turned on. BL0 and BL4 may be at 0 V or other low level as depicted by Vbl_good in FIG. 10 in the channel pre-clean phase 1000. A portion of the voltage of the channel of the NAND string 902 may also pass to ground at CELSRC.

FIG. 9B depicts a set of NAND strings and associated circuitry in a configuration which is consistent with the bit line pre-charge phase of FIG. 8, step 822, and which follows the configuration of FIG. 9A. The BLX transistors are turned on to supply a positive voltage at the power supply nodes 251-251d to the drains of the BLC transistors. The control gate voltage of the BLC transistors can be set in an attempt to clamp the corresponding bit line voltages. The clamping is successful for the NAND strings 900 and 904 since their bit line voltages are low, and allow a positive drain-to-source voltage at the corresponding BLC transistors. BL0 and BL4 can be clamped at V1=0.2 V, for example, as depicted in FIG. 10 for Vbl_good in the bit line pre-charge phase 1001. However, the clamping is unsuccessful for the NAND strings 901-903 since their bit line voltages are high, due to the reverse charging from the short circuit. BL1-BL3 remain at an elevated voltage as depicted in FIG. 10 for Vbl_sc in the bit line pre-charge phase 1001.

FIG. 9C depicts a set of NAND strings and associated circuitry in a configuration which is consistent with the bit line discharge phase of FIG. 8, step 823, and which follows the configuration of FIG. 9B. The BLX and BLC transistors are turned off so that they do not supply a bias to the bit lines. The voltages of BL0 and BL4 therefore discharge to a level V2<V1 as depicted in FIG. 10 for Vbl_good in the bit line discharge phase 1002. BL1-BL3 remain at an elevated voltage as depicted in FIG. 10 for Vbl_sc in the bit line discharge phase 1002.

FIG. 9D depicts a set of NAND strings and associated circuitry in a configuration which is consistent with the sensing phase of FIG. 8, step 824, and which follows the configuration of FIG. 9C. The BLC and XXL transistors are turned on to provide a conductive path from the sense circuits to the respective bit lines. A voltage at a sense node in the sense circuits can be monitored to determine a conductive or non-conductive state of the NAND strings, as discussed. For example, see Vsense in FIG. 10. The voltages of BL0 and BL4 remain at the discharged level V2 as depicted in FIG. 10 for Vbl_good in the sensing phase 1003.

BL1-BL3 remain at an elevated voltage as depicted in FIG. 10 for Vbl_sc in the sensing phase 1003. The voltages of BL1-BL3 are significantly high than the voltages of BL0 and BL4 so that the short circuited NAND strings can be easily distinguished from the non-short circuited NAND strings during the sensing phase.

FIG. 9E to 9H depict an example of a word line-to-memory hole short circuit without a bit line contact-to-bit line contact short circuit, consistent with FIG. 7G. In particular, the NAND string 902 has a word line-to-channel short circuit path 905 at WL95. However, there is no short circuit between the bit line contacts.

Figure 9E:
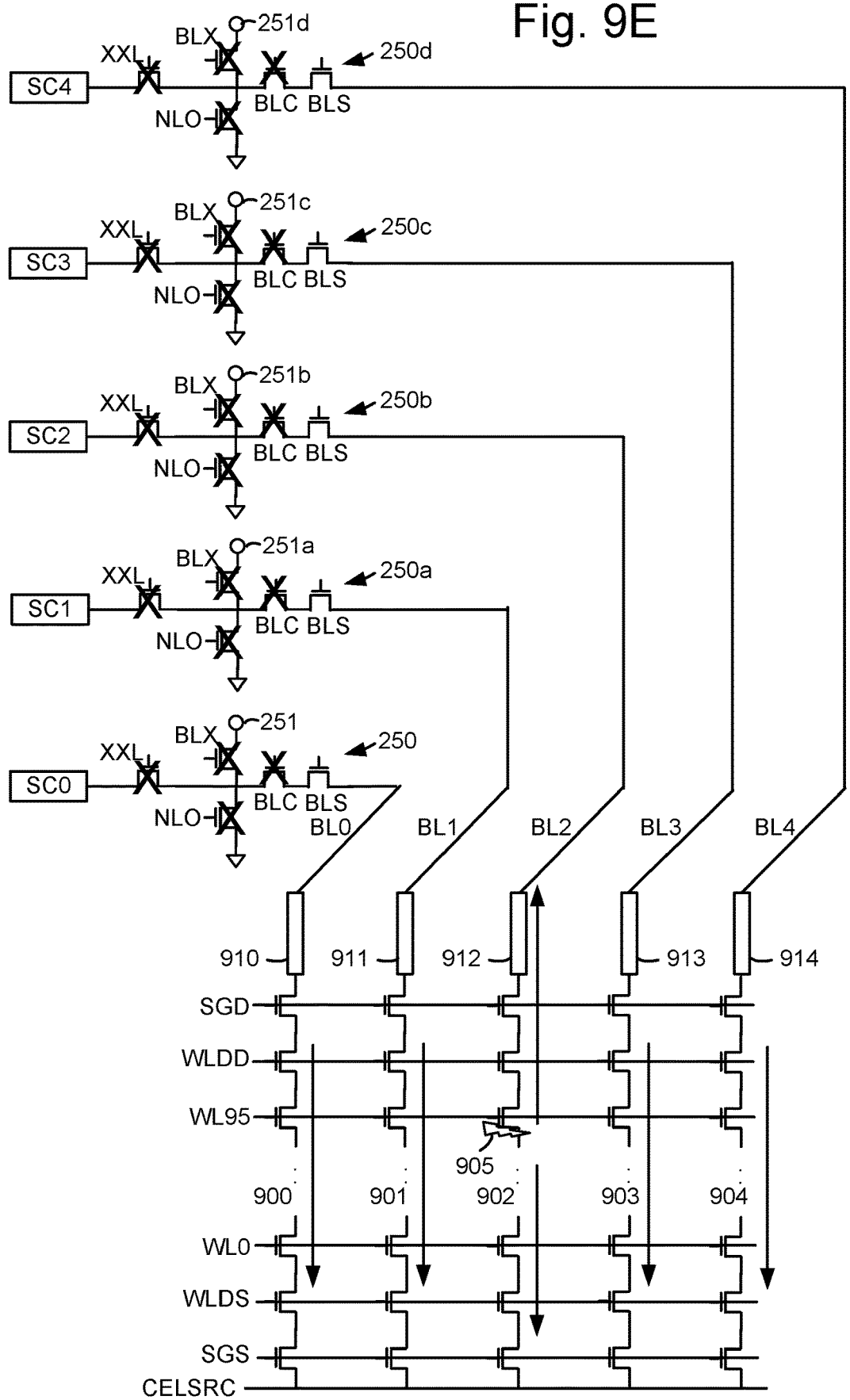
FIG. 9E depicts a set of NAND strings and associated circuitry in a configuration which is consistent with the channel pre-clean phase of FIG. 8, step 821, when there is a word line-to-memory hole short circuit but no bit line contact-to-bit line contact short circuit.

FIG. 9E depicts a set of NAND strings and associated circuitry in a configuration which is consistent with the channel pre-clean phase of FIG. 8, step 821, when there is a word line-to-memory hole short circuit but no bit line contact-to-bit line contact short circuit. A positive voltage on WL95 is leaked to the channel of the NAND string 902. The voltage passes to the bit line contact 912 and from there to BL2. BL2 therefore has an elevated voltage as depicted by Vbl_sc in FIG. 10 in the channel pre-clean phase 1000. For the non-short circuited NAND strings 900, 901, 903 and 904, the word line voltage does not leak to the channel. This allows their channels to be grounded at the CELSRC as the SGS transistors are turned on. BL0, BL1, BL3 and BL4 may be at 0 V or other low level as depicted by Vbl_good in FIG. 10 in the channel pre-clean phase 1000. A portion of the voltage of the channel of the NAND string 902 may also pass to ground at CELSRC.

Figure 9F:
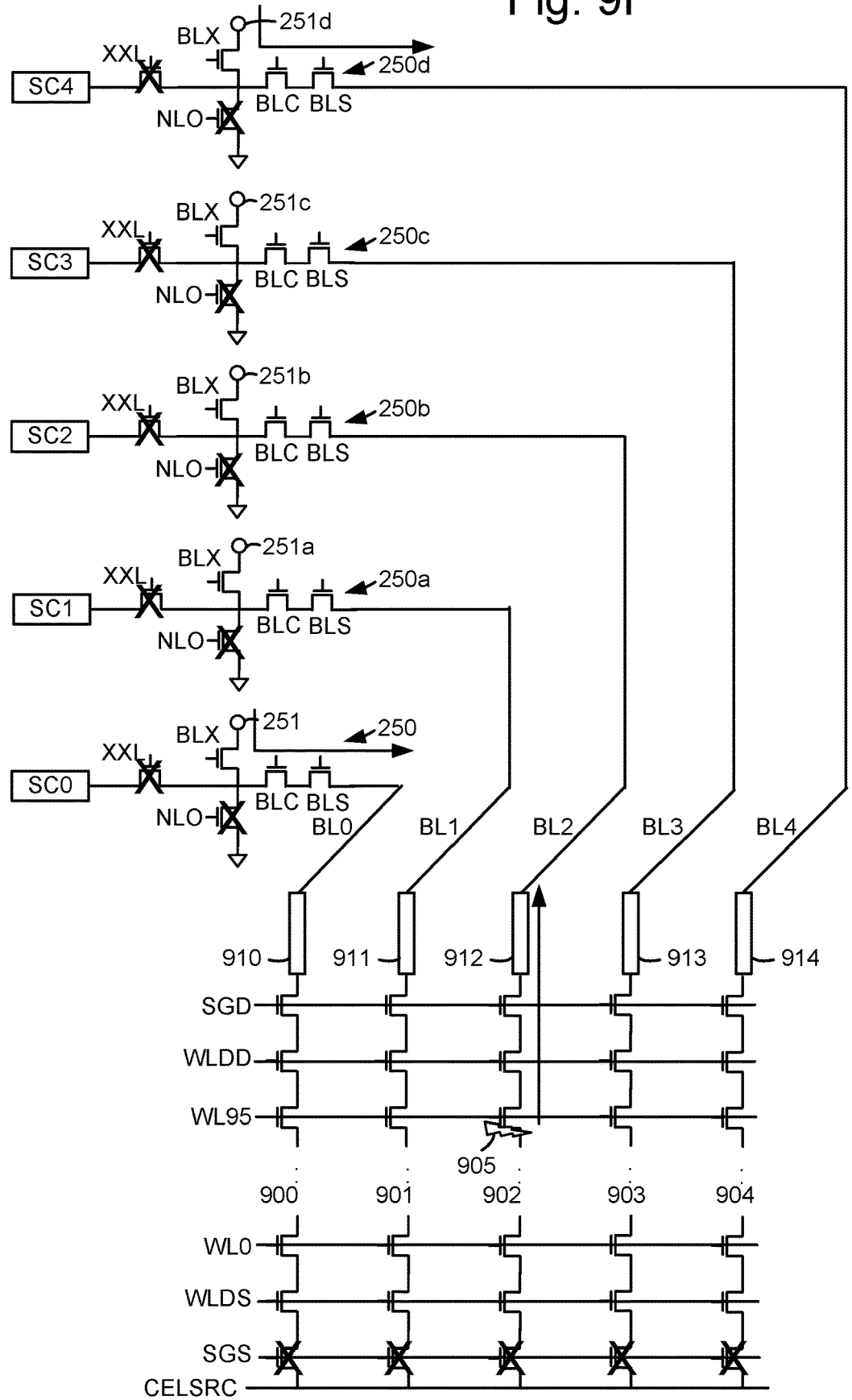
FIG. 9F depicts a set of NAND strings and associated circuitry in a configuration which is consistent with the bit line pre-charge phase of FIG. 8, step 822, and which follows the configuration of FIG. 9E.

FIG. 9F depicts a set of NAND strings and associated circuitry in a configuration which is consistent with the bit line pre-charge phase of FIG. 8, step 822, and which follows the configuration of FIG. 9E. The BLX transistors are turned on to supply a positive voltage at the power supply nodes 251-251*d* to the drains of the BLC transistors. The control gate voltage of the BLC transistors can be set in an attempt to clamp the corresponding bit line voltages. The clamping is successful for the NAND strings 900, 901, 903 and 904 since their bit line voltages are low, and allow a positive drain-to-source voltage at the corresponding BLC transistors. BL0, BL1, BL3 and BL4 can be clamped at V1=0.2 V, for example, as depicted in FIG. 10 for Vbl_good in the bit line pre-charge phase 1001. However, the clamping is unsuccessful for the NAND string 902 since its bit line voltage is high, due to the reverse charging from the short circuit. BL2 remains at an elevated voltage as depicted in FIG. 10 for Vbl_sc in the bit line pre-charge phase 1001.

Figure 9G:
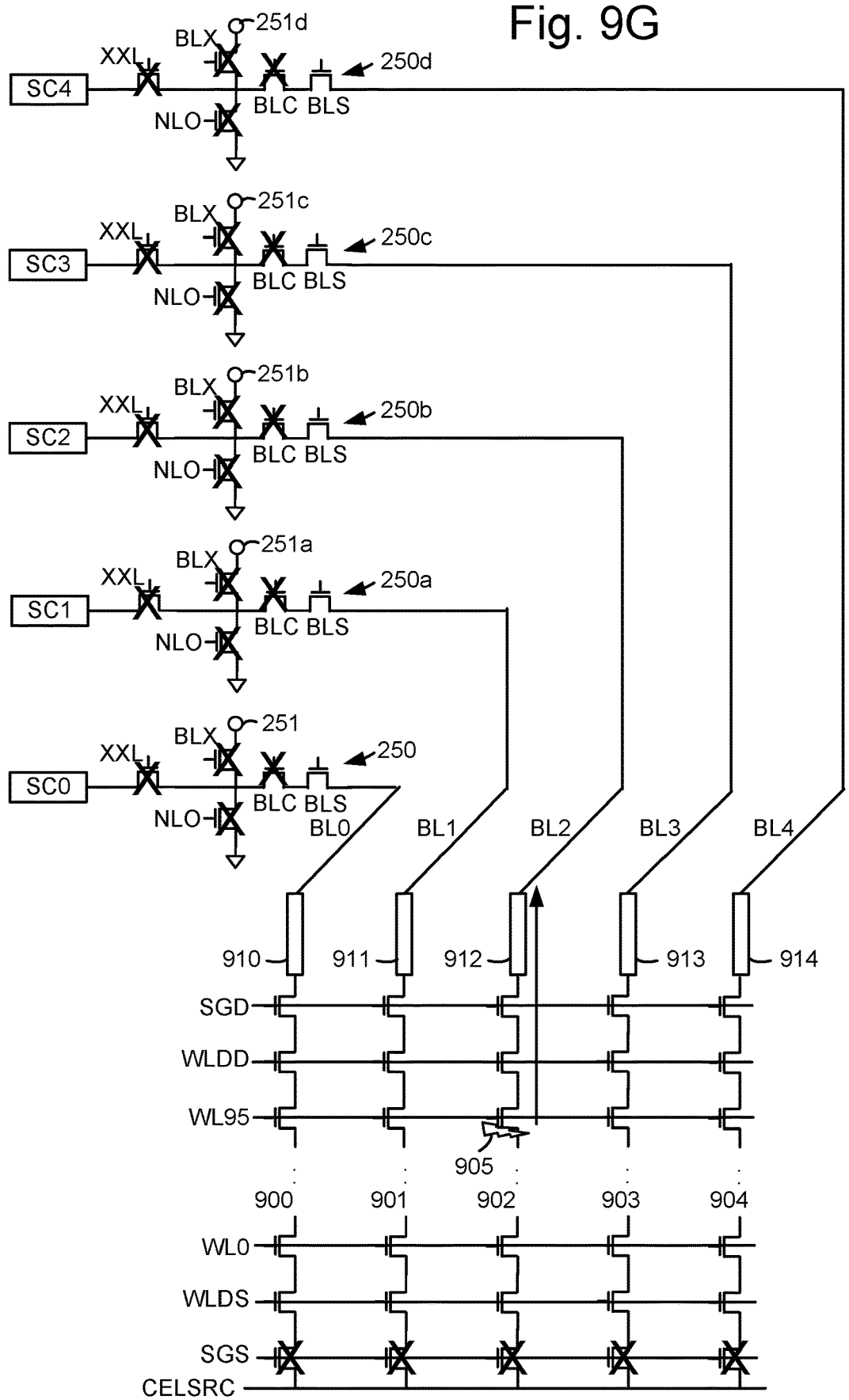
FIG. 9G depicts a set of NAND strings and associated circuitry in a configuration which is consistent with the bit line discharge phase of FIG. 8, step 823, and which follows the configuration of FIG. 9F.

FIG. 9G depicts a set of NAND strings and associated circuitry in a configuration which is consistent with the bit line discharge phase of FIG. 8, step 823, and which follows the configuration of FIG. 9F. The BLX and BLC transistors are turned off so that they do not supply a bias to the bit lines. The voltages of BL0, BL1, BL3 and BL4 therefore discharge to a level V2<V1 as depicted in FIG. 10 for Vbl_good in the bit line discharge phase 1002. BL2 remains at an elevated voltage as depicted in FIG. 10 for Vbl_sc in the bit line discharge phase 1002.

Figure 9H:
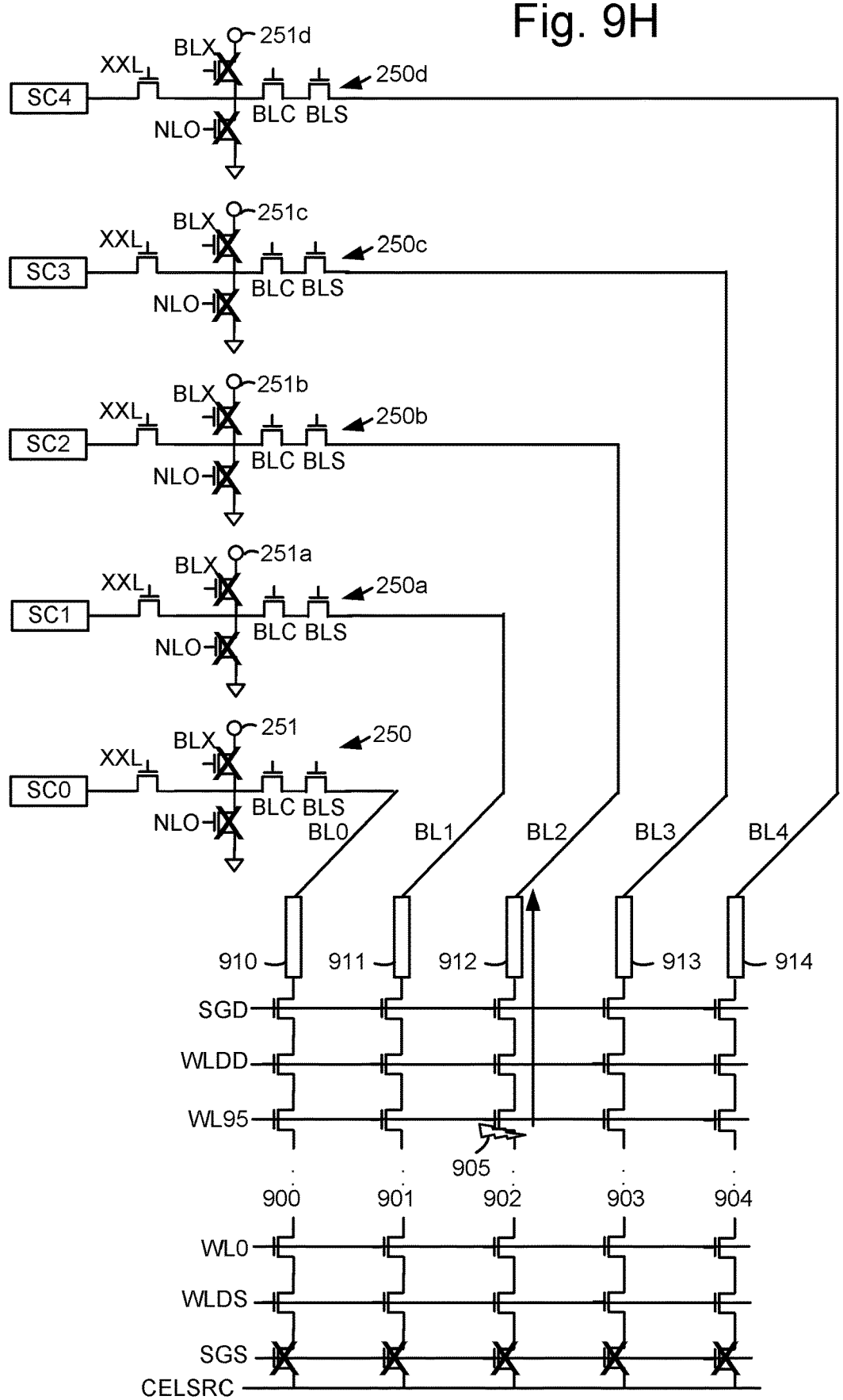
FIG. 9H depicts a set of NAND strings and associated circuitry in a configuration which is consistent with the sensing phase of FIG. 8, step 824, and which follows the configuration of FIG. 9G. The BLC and XXL transistors

FIG. 9H depicts a set of NAND strings and associated circuitry in a configuration which is consistent with the sensing phase of FIG. 8, step 824, and which follows the configuration of FIG. 9G. The BLC and XXL transistors are turned on to provide a conductive path from the sense circuits to the respective bit lines. The voltages of BL0, BL1, BL3 and BL4 remain at the discharged level V2 as depicted in FIG. 10 for Vbl_good in the sensing phase 1003. BL2 remains at an elevated voltage as depicted in FIG. 10 for Vbl_sc in the sensing phase 1003. The voltage of BL2 is significantly high than the voltages of BL0, BL1, BL3 and BL4 so that the short circuited NAND string can be easily distinguished from the non-short circuited NAND strings during the sensing phase.

FIG. 10 depicts voltage signals consistent with FIGS. 8 and 9A to 9D. The voltage signals are on a common time axis which includes time points t0-t5. The time points t0-t1, t1-t2, t2-t3, t3-t4 and t4-t5 correspond to the channel pre-clean phase 1000, the BL pre-charge phase 1001, the BL discharge phase 1002, the sensing phase 1003 and the recovery phase 1004, respectively.

Vbl_good is a voltage of a good bit line, e.g., a bit line which is not connected to a NAND string having a short circuit, whether it is a word line-to-channel short circuit or a BL contact-to-BL contact short circuit. A good bit line is not subject to reverse charging from a leaky (short circuited) word line during the short circuit detection operation. Vbl_good is at a low level such as 0 V in the phase 1000. In the phase 1001, the good bit lines are pre-charged to a small voltage V1, e.g., 0.2 V. In the phase 1002, the good bit lines are allowed to discharge to V2, which is less than V1. V2 can be about the same as the voltage in the phase 1000.

Vbl_sc is a voltage of a bit line connected to a NAND string having a short circuit, whether it is a word line-to-channel short circuit or a BL contact-to-BL contact short circuit to another NAND string which in turn has a word line-to-channel short circuit. Such a bit line is referred to as an affected bit line. A leaky bit line is subject to reverse charging from a leaky word line. An affected bit line is subject to reverse charging from a leaky word line. Vbl_sc increases to a first level L1 at t0*a* due to Vwl increasing to Vdd. Vsgd and Vsgs also increase to Vdd. Vdd is a power supply voltage such as 2-3 V. Vbl_sc increases further to a second level L2 at t0*b* when Vwl increases from Vdd to Vread, e.g., 8 V. Vsgd and Vsgs also increase further from Vdd to Vsg, e.g., 6 V. Vbl_sc increases further to a third level L3 at t1 when the SGS transistor (plot 1013) is turned off. The SGS transistor is therefore turned on and then off in the pre-charge phase, while the SGD transistor is turned on and remains on. L3 is potentially the peak level of Vbl_sc in the operation. At t0-t0*b*, the voltage of the leaky bit line leaks into the channel and moves toward both the bit line and CELSRC, since the SGD and SGS transistor, respectively, are turned on. At t0*b*-t1, the SGS transistor turns off so that additional charges which would have leaked to CELSRC are instead leaked to the bit line, increasing its voltage from L2 to L3.

Vwl is maintained at Vread until t4, in one approach. As a result, the bit line continues to be reverse charged by the leaky word line until t4. Although, since bit lines are long metal lines, some parasitic effects will cause Vbl_sc to slowly decrease to a level V3 during sensing.

Vbls is the control gate voltage of the BLS transistors as discussed, e.g., in connection with FIGS. 2 and 9A-9D. A turn on voltage can be applied throughout the operation.

Vblc is the control gate voltage of the BLC transistors. A turn on voltage of V4 is applied in phase 1001, and a higher turn on voltage of V5 is applied in phase 1003. Note that Vbl_sc is at V3>V5 during the sensing phase 1003 so that the reverse bit line charging continues for the affected bit lines. The BLC transistor does not clamp the affected bit line.

Vblx is the control gate voltage of the BLX transistors. This transistor is turned on using Von to supply a voltage to the drain of the BLC transistor, during the bit line pre-charge phase 1001.

Vnlo is the control gate voltage of the NLO transistors. This transistor is turned off (set in a non-conductive state) by setting Vnlo=Voff to avoid creating a ground path for the sets of transistors.

Vxxl is the control gate voltage of the XXL transistors. This transistor is turned on to connect a sense circuit to a respective bit line, when BLC and BLS are also turned on. Vxxl=Von during the sensing phase 1003 and Voff in the other phases.

Vsgd is the control gate voltage of the SGD transistors, and Vsgs is the control gate voltage of the SGS transistors. In one approach, depicted by plot 1010, these voltages increase in two steps in the phase 1000 at t0-t0b. The two steps represent turn on voltages of Vdd and Vsg. In another approach, depicted by plot 1011, these voltages increase in one step to Vsg. From t0b-t4, Vsgd is maintained at the turn on level of Vsg (plot 1012) while Vsgs is decreased to a turn off level of, e.g., 0 V (plot 1013). In one approach, Vsgd is set as indicated for all sub-blocks of a block. In another approach, Vsgd is set as indicated for one selected sub-block of a block.

Vwl is the control gate or word line voltage for the memory cells. Vwl can be applied to all of the memory cells. In one approach, depicted by plot 1020, Vwl increases in two steps in the phase 1000 at t0-t0b. The two steps represent Vdd and Vread. In another approach, depicted by plot 1021, Vwl increases in one step to Vread. From t0b-t4, Vwl is maintained at Vread in one example. This ensures that Vbl_sc remains high by being reversely charged so that it can be distinguished from Vbl_good in the sensing phase.

Vsense is the voltage of the sense node in a sense circuit. During the sensing phase, Vsense is set to an initial level at t3. During the sensing process, when the XXL transistor is turned on, Vsense will decay significantly below a threshold level Vt at a sense time ts as represented by a plot 1031 if the associated bit line is not reversely charged, indicating the lack of a word line-to-channel short circuit. Vsense will remain above Vt at ts as represented by a plot 1030 if the associated bit line is reversely charged, indicating the presence of a word line-to-channel short circuit.

A control circuit can be configured with commands and parameters for implementing the operation. For example, commands can be defined for initiating the short circuit operation and each of its phases. Further, parameters can be set for various voltage levels and timings, as follows:

V4: BLC control gate voltage during the bit line pre-charge phase, where a bit line voltage for a normal, non-short circuited NAND string is clamped by this voltage;

V5: BLC control gate voltage during the sensing phase, used for setting a bit line sense voltage;

T1: defines the duration of the bit line pre-charge phase; and

T2: defines the duration of the bit line discharge phase.

In an example implementation, the first phase includes concurrently applying a positive voltage (Vread) to the word lines, a turn on voltage (Vdd or Vsg) to the source end select gate transistors and the drain end select gate transistors, and a turn off voltage (0 V) to the clamp transistors. The second phase includes continuing to apply the positive voltage to the word lines, applying a turn off voltage (0 V) to the source end select gate transistors, continuing to apply the turn on voltage (Vsg) to the drain end select gate transistors, and applying a first turn on voltage (V4) to the clamp transistors. The third phase includes concurrently continuing to apply the positive voltage to the word lines, continuing to apply the turn off voltage to the source end select gate transistors, continuing to apply the turn on voltage to the drain end select gate transistors, and applying a turn off voltage (0 V) to the clamp transistors. The fourth phase includes concurrently sensing the plurality of NAND strings, continuing to apply the positive voltage to the word lines, continuing to apply the turn off voltage to the source end select gate transistors, continuing to apply the turn on voltage to the drain end select gate transistors, and applying a second turn on voltage (V5) to the clamp transistors.

Generally, during the bit line pre-charge phase, the all bit line pre-charge voltage (V1) is set relatively low, and the bit lines are clamped by the BLC control gate voltage (V4). V1=V4−Vth of the BLC transistor, in one approach. For a NAND string with an unopened memory hole, during the sensing phase, the bit line voltage will be V2<V1 since there is no leaky path between a word line and a memory hole to reverse charge the bit line. In the voltage sense operation, a bit line sense voltage which is defined by V5 will be set higher than V2. V2=V5−Vth of the BLC transistor, in one approach. The clamping of the bit line voltage is for the good bit lines, which are not reversely charged. Hence, a NAND string with an unopened memory hole can be sensed as a "1", indicating an erased or conductive state. The same is true for a good NAND string with no unopened memory hole and no short circuit. Accordingly, the operation avoids distinguishing between an unopened memory hole and a normal memory hole, but instead identifies a word line-to-channel short circuit. Other operations can be performed to distinguish between an unopened memory hole and a normal memory hole.

For a NAND string with a word line-to-channel short circuit, the bit line will be reversely charged to a high voltage V3 which is higher than V5. As mentioned, the reverse charged is caused by the word line voltage, Vread, reaching the bit line through the short circuit. This type of NAND string is sensed as a "0", indicating a programmed or non-conductive state. Since the memory cells are in the erased state at the start of the operation, this type of NAND string is identified as being problematic. The presence of a cluster of multiple NAND strings of this type indicates a fault which can render the block unusable.

In the all bit line voltage sense mode, all bit lines are pre-charged to V1, instead of charging odd bit lines to V1 and even bit lines to 0 V. So, in the case of a cluster of short circuited NAND strings, although one NAND string has the word line-to-channel short circuit, the corresponding bit line and the adjacent bit lines in the cluster are concurrently reverse charged to a high voltage (V3) which will be higher than V5 during sensing.

Note that the channel pre-clean phase makes it easier to distinguish the NAND strings with a word line-to-channel short circuit since it increases the amount of reverse charge on the affected bit lines. However, this phase could be omitted, such as to save time. In this case, the reverse charge of the affected bit lines begins in the bit line pre-charge phase.

FIG. 11A to 11H depict example configurations of a block in a fabrication process, showing how defects during the process result in short circuits. The figures provide a general overview and do not necessarily include all steps. The etching processes can include reactive ion etching, for example.

FIG. 11A depicts a first configuration of a block in a fabrication process which results in a short circuit consistent with FIGS. 6 and 7C to 7G, where alternating layers are formed in a stack 1100. The layers are formed on a substrate 1101 and can include a dielectric such as densified Tetraethyl orthosilicate, e.g., Si(OC2H5)4 or dTEOS, and a sacrificial material such as SiN. The layers of sacrificial material are shaded in the figure. The layers 1102 and 1105 are example bottom and top dielectric layers, respectively, and the layers 1103 and 1104 are example bottom and top sacrificial layers, respectively.

Figure 11B:
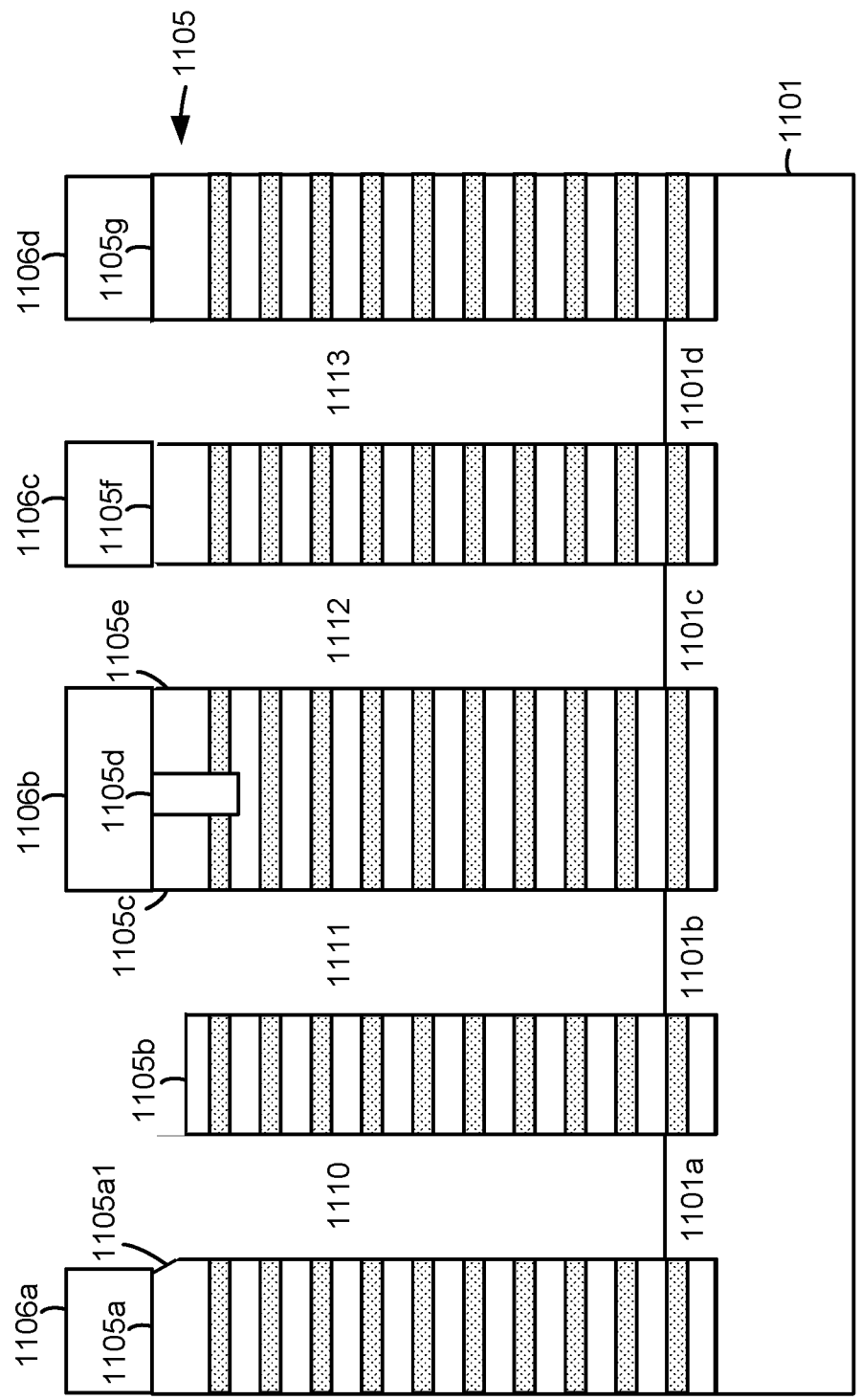
FIG. 11B depicts a second configuration of a block in a fabrication process, where a non-uniform etching of the top dielectric layer 1105 results in an over-etched dielectric region 1105b and a corner-etched dielectric region 1105a having a corner 1105a1.

FIG. 11B depicts a second configuration of a block in a fabrication process, where a non-uniform etching of the top dielectric layer 1105 results in an over-etched dielectric region 1105b and a corner-etched dielectric region 1105a having a corner 1105a1. A mask is deposited on the stack of FIG. 11A and patterned to form mask regions 1106a-1106d. Due to the presence of particles or other process errors, the mask region is not properly patterned. As a result, when the memory holes 1110-1113 are etched in the stack via the mask regions, the region 1105b of the dielectric layer is over etched and has a lower height than the other regions 1105a, 1105c, 1105e, 1105f and 1105g of the dielectric layer. Additionally, a corner 1105a1 is formed on the region 1105a of the dielectric layer. These are examples of various types of process errors which can lead to short circuits as described herein.

After the memory holes are etched, epitaxial regions 1101a-1101d can be grown from the substrate in the memory holes 1110-1113, respectively.

A dielectric wall 1105d can be also be formed to divide the topmost sacrificial layer 1104 to form separate sub-blocks.

Also at this time, the sacrificial material can be removed and replaced with a metal such as W to form the conductive control gate lines and word lines. The metal is shown in FIG. 11C-11H by the layers with a slash line pattern. The replacement can be made via voids which are formed in the stack along its length. For example, a void in which the local interconnect 651 of FIG. 6 is formed may be used. The SiN in the control gate layers may be removed using a wet etch in the voids, followed by depositing a metal. The metal layer 1124 (FIG. 11C) is an example of a conductive word line.

Figure 11C:
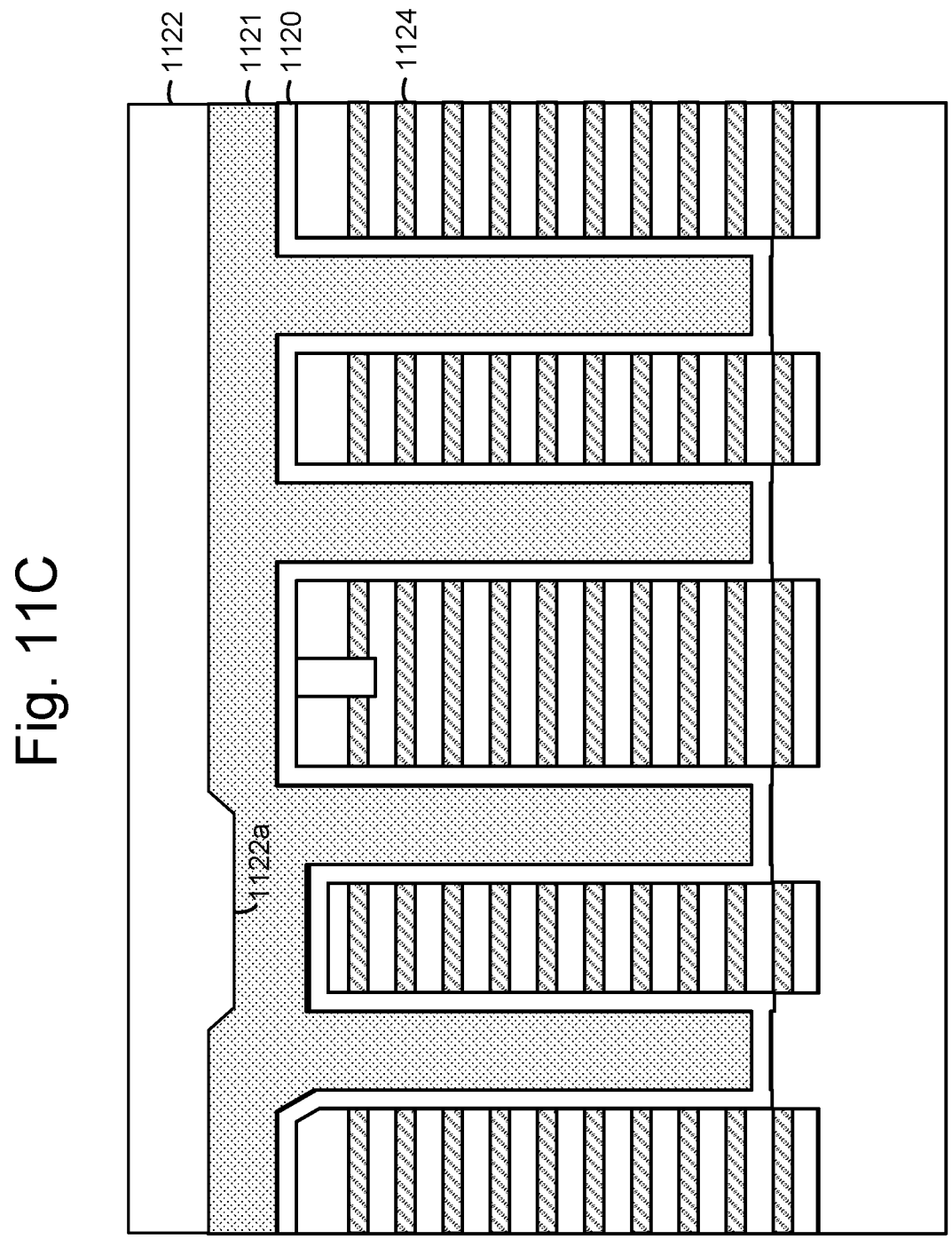
FIG. 11C depicts a third configuration of a block in a fabrication process, where layers 1120 are deposited in the memory holes 1110-1113, a filler 1121 is deposited, and a mask layer 1122 is deposited.

FIG. 11C depicts a third configuration of a block in a fabrication process, where layers 1120 are deposited in the memory holes 1110-1113, a filler 1121 is deposited, and a mask layer 1122 is deposited. The layers 1120 can include a blocking oxide layer, followed by a charge-trapping layer, a tunneling layer and a channel layer. These can comprise aluminum oxide (Al2O3)-nitride (Si3N4)-oxide (SiO2)-silicon (Si) layers, as discussed previously. In one approach, the channel layer is deposited as polysilicon. In another approach, the channel layer is deposited as undoped amorphous silicon (aSi) and later heated to form polysilicon. The channel layer is typically the last deposited layer among the layers 1120 and is adjacent to a dielectric core which is subsequently formed in the memory holes. The filler 1121 can comprise a hard mask material such as Advanced Patterning Film™, available from Applied Materials, Inc. This film is easily strippable using chemical vapor deposition. A photoresist mask layer 1122 is then deposited. The photoresist mask layer includes a low region 1122a due to the reduced height of the region 1105b of the dielectric layer (FIG. 11B).

Figure 11D:
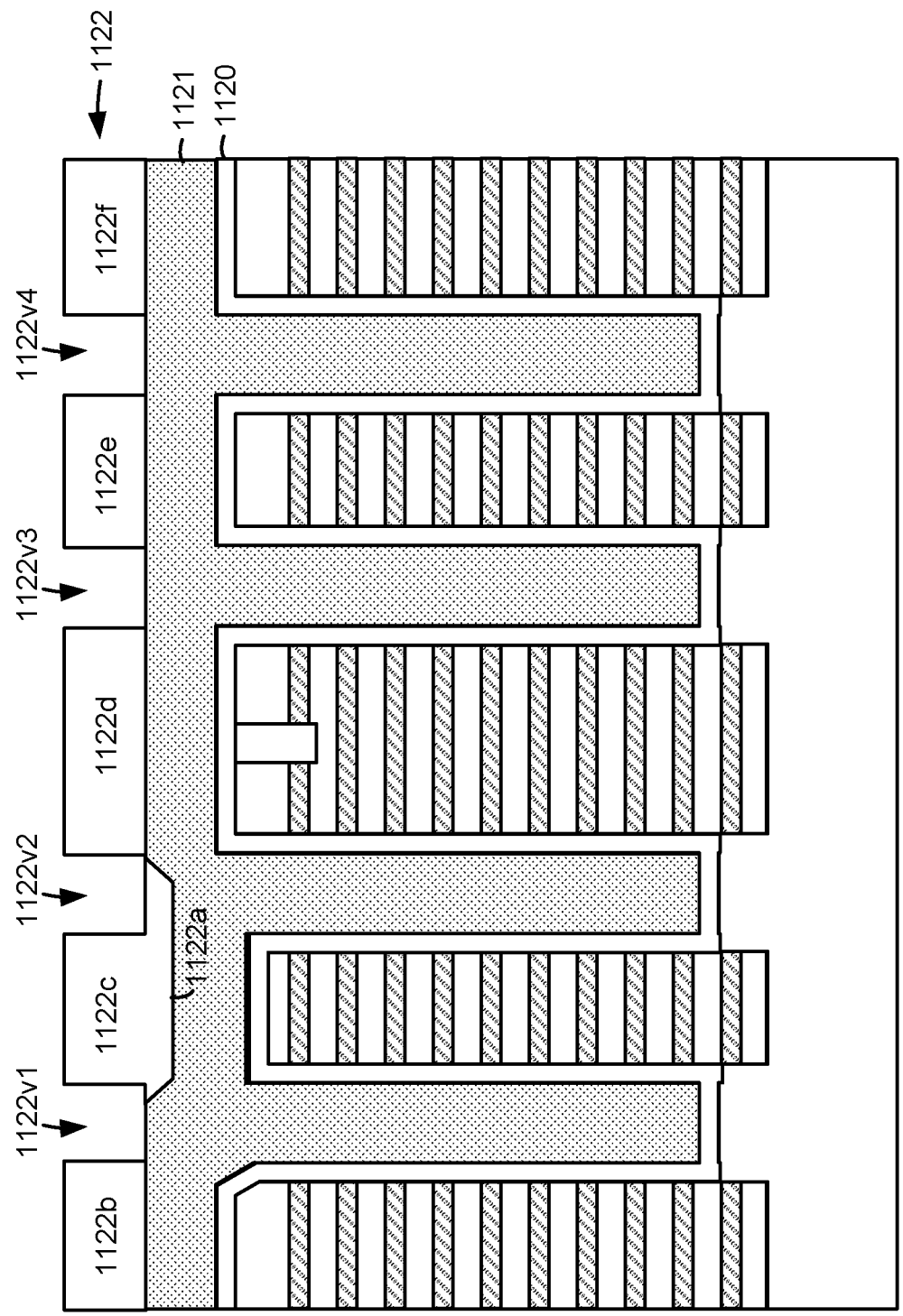
FIG. 11D depicts a fourth configuration of a block in a fabrication process, where the mask layer 1122 is patterned, forming voids 1122v1-1122v4.

FIG. 11D depicts a fourth configuration of a block in a fabrication process, where the mask layer 1122 is patterned, forming voids 1122v1-1122v4 and mask layer regions 1122b-1122f. The mask layer region 1122a remains.

Figure 11E:
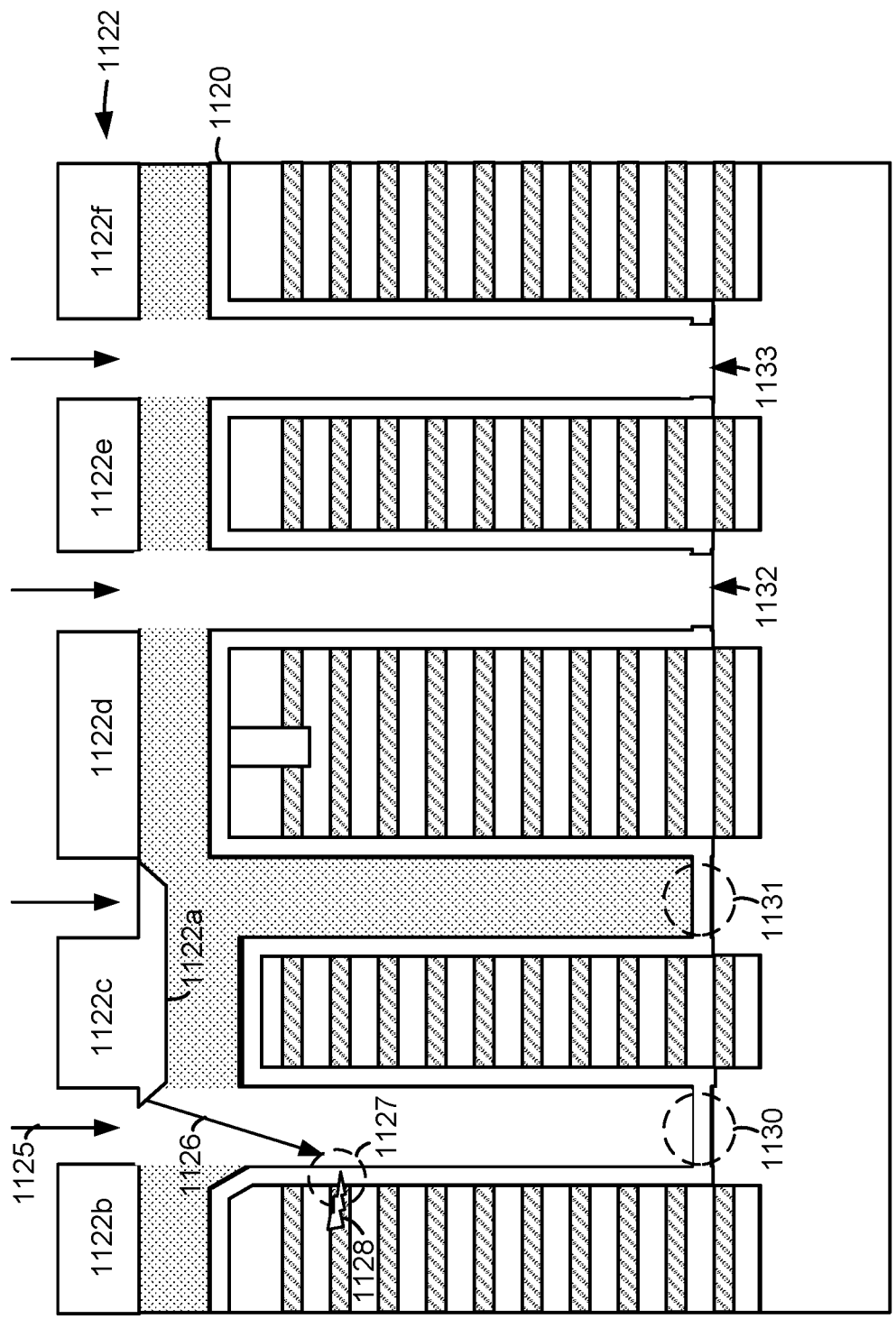
FIG. 11E depicts a fifth configuration of a block in a fabrication process, where the patterned mask layer 1122 is used to etch through the filler 1121 and portions of the layers 1120 at the bottom of the memory holes.

FIG. 11E depicts a fifth configuration of a block in a fabrication process, where the patterned mask layer 1122 is used to etch through the filler 1121 and portions of the layers 1120 at the bottom of the memory holes. A purpose of this step is to use the mask regions to direct an etchant in each memory hole and through the layers 1120 at the bottom of each memory hole to form an opening which allows the channel to contact the substrate epitaxial region. In this example, the low region 1122a interferes with the etching of the first two memory holes on the left of the figure. In particular, etching particles are refracted from the low region 1122a, as depicted by the arrows 1125 and 1126, and contact a region 1127 of the layers 1120. This contact can damage the region 1127 and form a word line-to-channel short circuit 1128. Additionally, the etchant does not properly reach the bottoms 1130 and 1131 of the memory holes so that the layers 1120 are not etched through. These memory holes are therefore unopened at the bottom.

In contrast, the etchant does properly reach the bottoms 1132 and 1133 of the two memory holes on the right side of the figure so that the layers 1120 are etched through.

FIG. 11F1 depicts a sixth configuration of a block in a fabrication process, where an additional polysilicon layer 1120a and a dielectric material 1139 are deposited. The additional polysilicon layer 1120a ensures that there is an electrical connection between the substrate and the polysilicon layer of the layers 1120, for the two memory holes on the right side of the figure in which the bottom portion of the layers 1120 was etched through. The dielectric material can be SiO2, for example. The dielectric material is used to form a dielectric core in each memory hole, such as depicted in FIG. 11F2. The dielectric core is surrounded by a polysilicon channel layer, which is represented by the additional polysilicon layer 1120a and a portion of the layers 1120.

FIG. 11F2 depicts a seventh configuration of a block in a fabrication process, where the dielectric material is etched back to form dielectric cores 1140-1143 in the memory holes, after which a doped silicon cap layer 1145 is deposited. The excess dielectric material of FIG. 11F1 is removed, leaving the dielectric cores 1140-1143 in the memory holes. See, e.g., the memory holes 1110-1113 of FIG. 11B. The cap layer 1145 comprising, e.g., n+doped amorphous silicon is then deposited over the stack.

FIG. 11G depicts an eighth configuration of a block in a fabrication process, where the doped silicon cap layer 1145 is etched to form bit line contacts 1145a1, 1145a3, 1145b and 1145c. The cap layer is etched back. Ideally, this results in a separate bit line contact for each NAND string 1180-1183. For example, separate bit line contacts 1145b and 1145c are successfully formed for the NAND strings 1182 and 1183, respectively. However, the bit line contacts 1145a1 and 1145a3 for the NAND strings 1180 and 1181, respectively, are connected in a continuous doped silicon region 1145a and short circuited together by a region 1145a2, forming a short circuit path 1129. Portions of the layers 1120 and 1120a which were on top of the stack are also etched away.

Figure 11H:
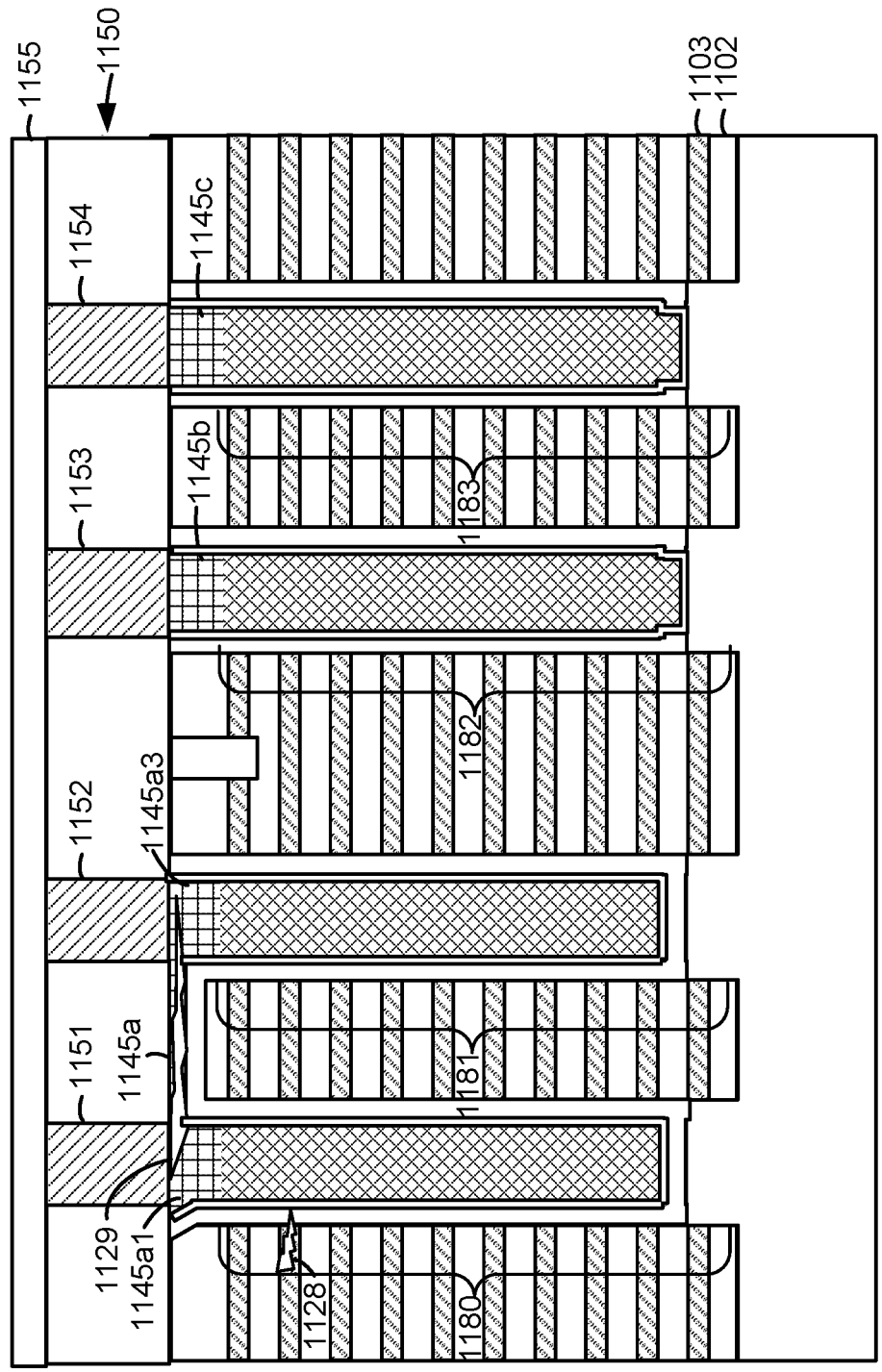
FIG. 11H depicts a ninth configuration of a block in a fabrication process, where vias 1151-1154 are formed above the bit line contacts 1145a1, 1145a3, 1145b and 1145c, respectively, and a bit line 1155 is formed above the vias in an insulating layer 1150.

FIG. 11H depicts a ninth configuration of a block in a fabrication process, where vias 1151-1154 are formed above the bit line contacts 1145a1, 1145a3, 1145b and 1145c, respectively, and a bit line 1155 is formed above the vias in an insulating layer 1150. The word line-to-channel short circuit path 1128 is depicted along with the BL contact-to-BL contact short circuit path 1129.

Figure 12A:
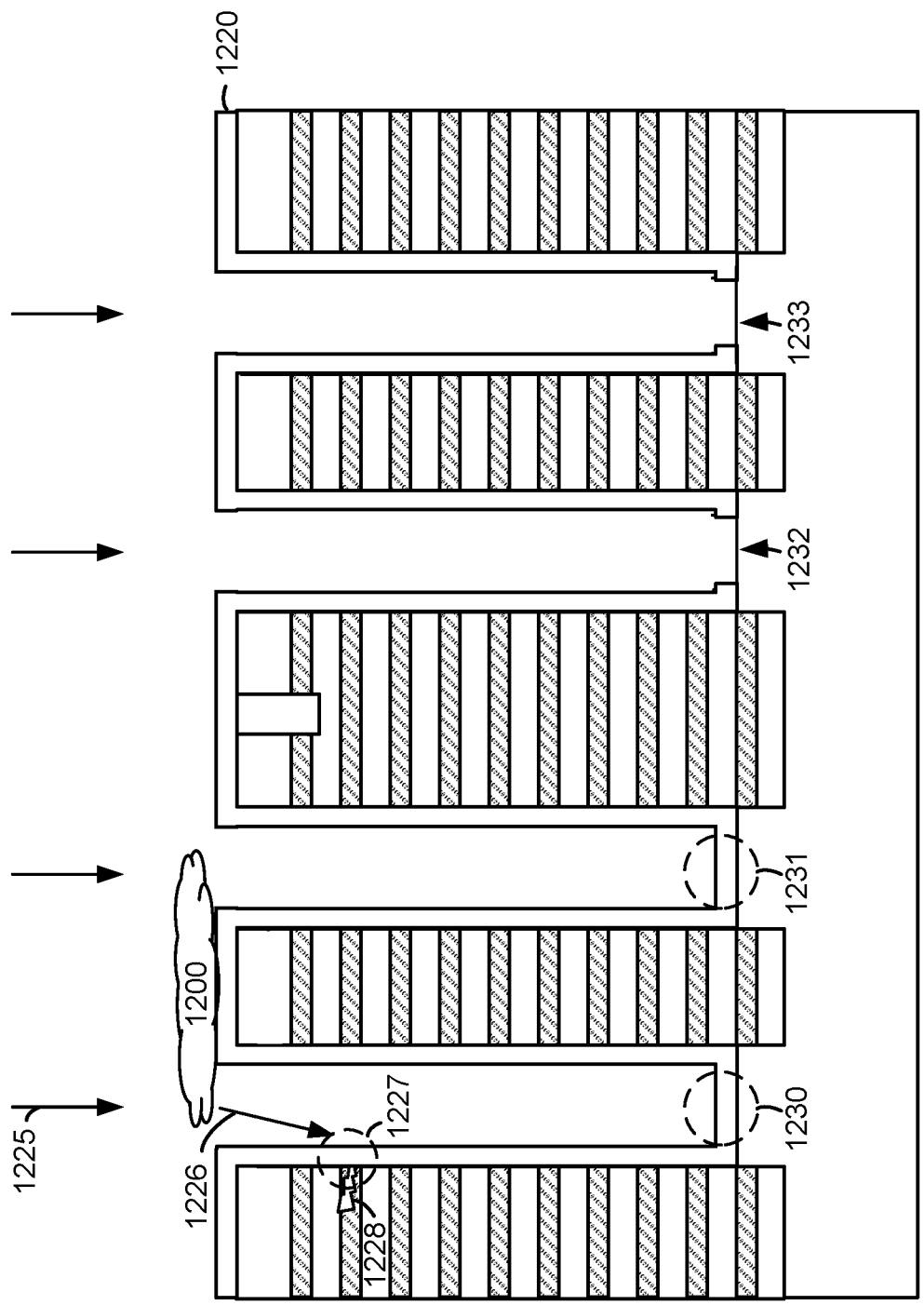
FIG. 12A depicts a configuration of a block in another example of a fabrication process which results in a short circuit consistent with FIGS. 6 and 7C to 7G.
Figure 12B:
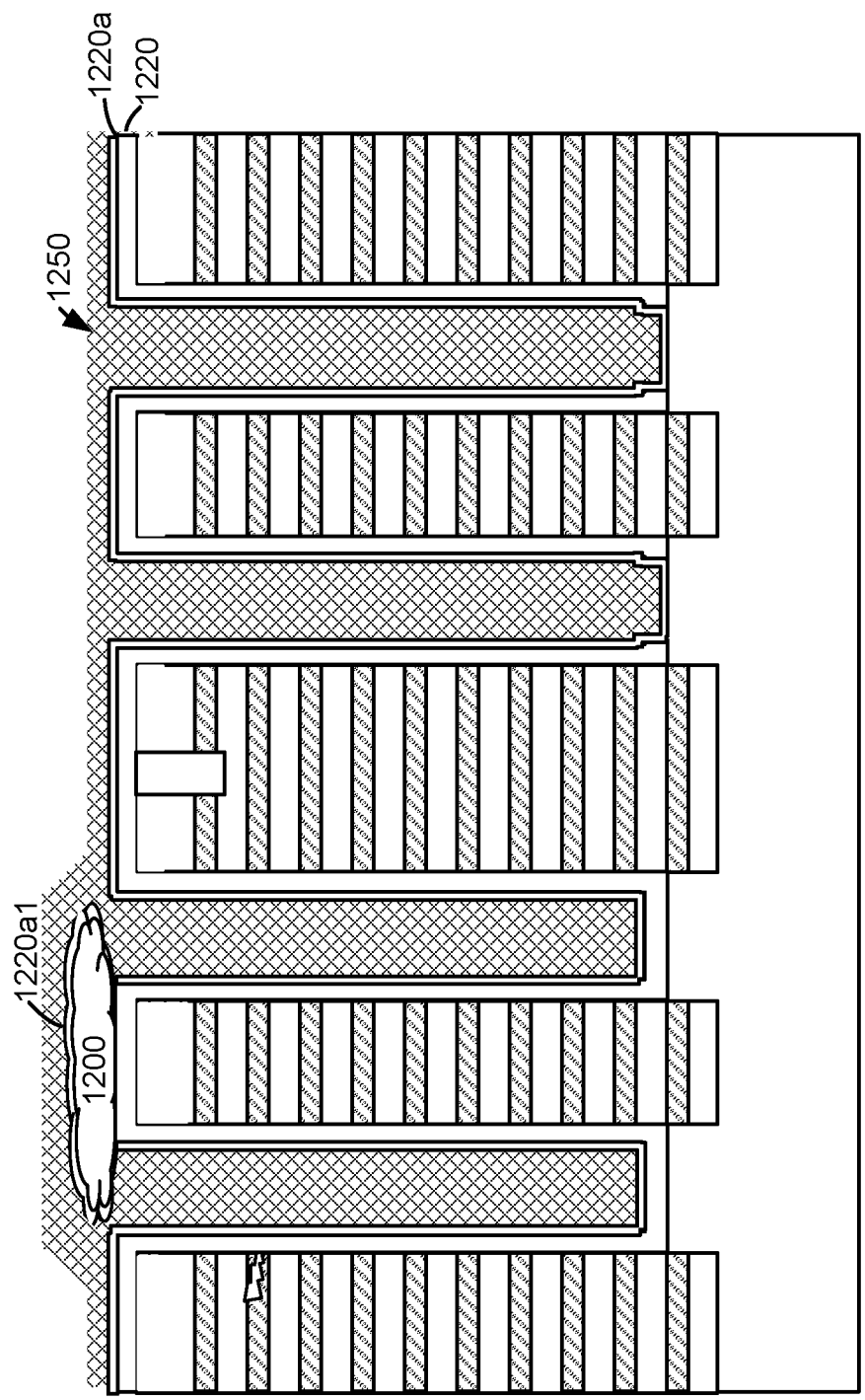
FIG. 12B depicts a configuration of a block which follows the configuration of FIG. 12A, where a dielectric material 1250 and an additional polysilicon layer 1220a are deposited.
Figure 12C:
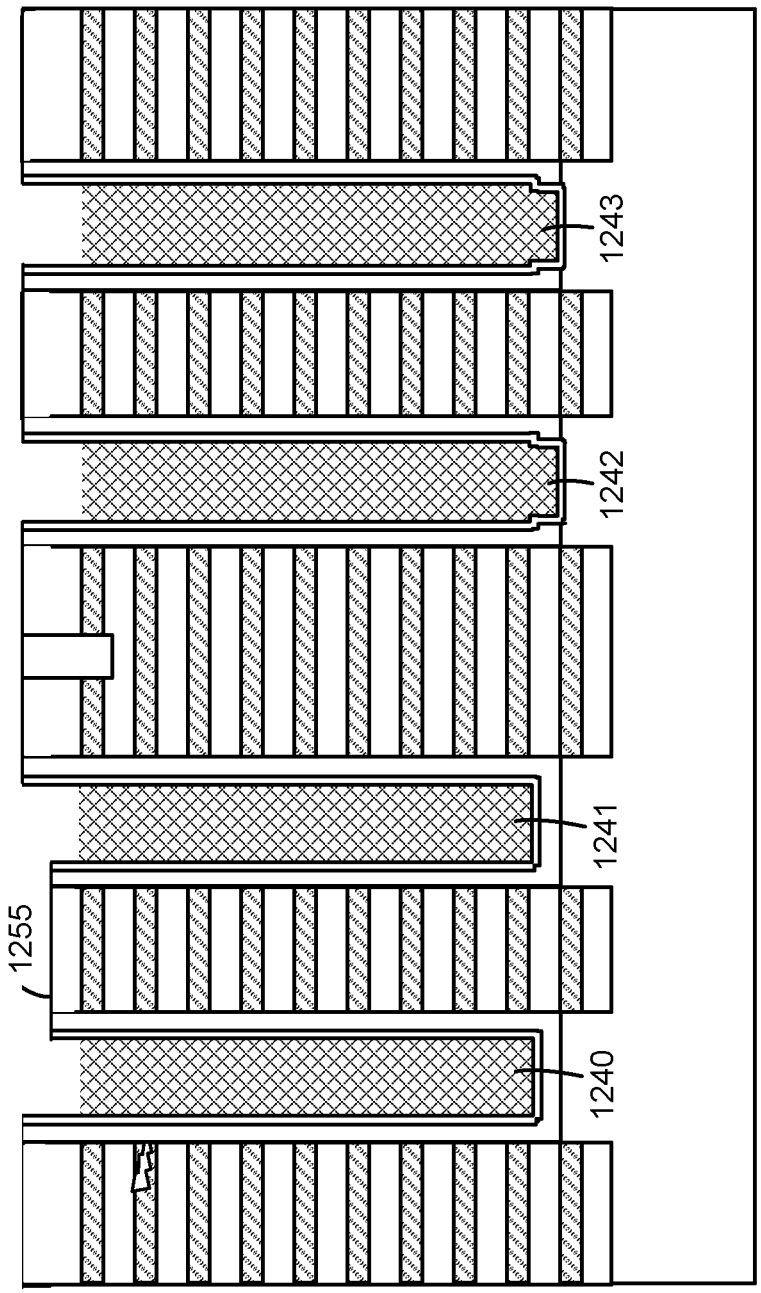
FIG. 12C depicts a configuration of a block which follows the configuration of FIG. 12B, where the dielectric material is etched back.

FIG. 12A to 12C depict another example fabrication process which results in a short circuit.

FIG. 12A depicts a configuration of a block in another example of a fabrication process which results in a short circuit consistent with FIGS. 6 and 7C to 7G. This configuration is an alternative to FIG. 11E. In this case, a contaminating particle 1200 such as particle of dust is present which interferes with the etching of the bottom of some of the memory holes. The particle is present after the layers 1220, similar to the layers 1120, are deposited. As before, etch particles can refract from the irregular surface of the contaminating particle and damage a portion of the layers in the memory hole, such as during etching of the memory holes to open a path at the bottom of the memory hole. For example, see the damaged region 1227. In particular, etching particles are refracted from the particle 1200, as depicted by the arrows 1225 and 1226. This causes a word line-to-channel short circuit path 1228. Additionally, the bottom of the memory hole may remain unopened (see the bottoms 1230 and 1231 of the memory holes. In contrast, the etchant does properly reach the bottoms 1232 and 1233 of the two memory holes on the right side of the figure so that the layers 1220 are etched through.

FIG. 12B depicts a configuration of a block which follows the configuration of FIG. 12A, where a dielectric material 1250 and an additional polysilicon layer 1220*a* are deposited. The dielectric material 1250 is deposited to fill the memory holes, and conforms to the shape of the particle on top of the stack. The additional polysilicon layer 1220*a* ensures that there is an electrical connection between the substrate and the polysilicon layer of the layers 1220, for the two memory holes on the right side of the figure in which the bottom portion of the layers 1220 was etched through. The additional polysilicon layer includes a portion 1220*a*1 which is on the particle 1200. The dielectric material forms a dielectric core in each memory hole, such as depicted in FIG. 12C. The dielectric core is surrounded by a polysilicon channel layer, which is represented by the additional layer 1220*a* and a portion of the layers 1220.

FIG. 12C depicts a configuration of a block which follows the configuration of FIG. 12B, where the dielectric material is etched back. The etch back forms dielectric cores 1240-1243 in the memory holes. However, the presence of the particle results in an over-etched dielectric region 1255, similar to the region 1105*b* of FIG. 11B. Specifically, the particle creates a region with a lower resistance to the etchant so that this region is etched back at a higher rate than surrounding regions. Portions of the layers 1220, 1220*a* and 1220*a*1 (FIG. 12B) which were on top of the stack are also etched away.

Subsequently, the doped silicon cap layer 1145 is deposited as in FIG. 11F2. The doped silicon cap layer 1145 is then etched back as in FIG. 11G, resulting in the bit line contacts and the associated short circuit 1129.

Accordingly, it can be seen that in one implementation, an apparatus comprises: a control circuit configured to connect to a plurality of NAND strings via a plurality of word lines and a plurality of bit lines, each NAND string comprises memory cells between a source end select gate transistor and a drain end select gate transistor, the memory cells are connected to the plurality of word lines, each bit line is connected to a clamp transistor which is configured to clamp a voltage of the bit line. The control circuit, to perform successive first, second, third and fourth phases of a short circuit detection operation, is configured to: in the first phase, concurrently apply a positive voltage to the word lines, a turn on voltage to the drain end select gate transistors, a turn on voltage follow by a turn off voltage to the source end select gate transistors, and a turn off voltage to the clamp transistors; in the second phase, concurrently continue to apply the positive voltage to the word lines, apply a turn off voltage to the source end select gate transistors, continue to apply the turn on voltage to the drain end select gate transistors, and apply a first turn on voltage to the clamp transistors; in the third phase, concurrently continue to apply the positive voltage to the word lines, continue to apply the turn off voltage to the source end select gate transistors, continue to apply the turn on voltage to the drain end select gate transistors, and apply a turn off voltage to the clamp transistors; and in the fourth phase, concurrently sense the plurality of NAND strings, continue to apply the positive voltage to the word lines, continue to apply the turn off voltage to the source end select gate transistors, continue to apply the turn on voltage to the drain end select gate transistors, and apply a second turn on voltage to the clamp transistors.

In another implementation, a method comprises: performing a bit line pre-charge phase of a short circuit detection operation for a plurality of NAND strings, the plurality of NAND strings are connected to a plurality of word lines and comprise a short circuited NAND string and non-short circuited NAND strings, each NAND string is connected to a respective bit line of a plurality of bit lines, each bit line is connected to a clamp transistor which is configured to clamp a voltage of the bit line, and the performing the bit line pre-charge phase comprises biasing the clamp transistors to charge up the bit lines of the non-short circuited NAND strings while applying a positive voltage to the plurality of word lines; performing a bit line discharge phase of the short circuit detection operation, the performing the bit line discharge phase comprises turning off the clamp transistors to discharge the bit lines of the non-short circuited NAND strings while continuing to apply the positive voltage to the plurality of word lines; and performing a sensing phase of the short circuit detection operation, the performing the sensing phase comprises connecting sense circuits to the bit lines of the non-short circuited NAND strings and to a bit line of the short circuited NAND string while continuing to apply the positive voltage to the plurality of word lines.

In another implementation, an apparatus comprises: a control circuit configured to connect to a plurality of NAND strings, the plurality of NAND strings are connected to a plurality of word lines and comprise a first short circuited NAND string which is short circuited to a leaky word line of the plurality of word lines, a second short circuited NAND string which is short circuited to the first short circuited NAND string, and non-short circuited NAND strings, which are not short circuited to another NAND string, each NAND string is connected to a respective bit line of a plurality of bit lines; and a memory interface connected to the circuit, the circuit is configured to issue a command via the memory interface to perform an operation which distinguishes the first short circuited NAND string and the second short circuited NAND string from the non-short circuited NAND strings, the operation involves sensing the plurality of NAND strings after pre-charging and discharging bit lines connected to the non-short circuited NAND string while a bit line connected to the first short circuited NAND string is charged up by a voltage applied to the leaky word line, the leaky word line is electrically connected to the bit line of the first short circuited NAND string via a channel of the first short circuited NAND string.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a control circuit configured to connect to a plurality of NAND strings via a plurality of word lines and a plurality of bit lines, each NAND string comprises memory cells between a source end select gate transistor and a drain end select gate transistor, the memory cells are connected to the plurality of word lines, each bit line is connected to a clamp transistor which is configured to clamp a voltage of the bit line, and the control circuit, to perform successive first, second, third and fourth phases of a short circuit detection operation, is configured to:
in the first phase, concurrently apply a positive voltage to the word lines, a turn on voltage to the drain end select gate transistors, a turn on voltage followed by a turn off voltage to the source end select gate transistors, and a turn off voltage to the clamp transistors;
in the second phase, concurrently continue to apply the positive voltage to the word lines, the turn off voltage to the source end select gate transistors, and the turn on voltage to the drain end select gate transistors, and apply a first turn on voltage to the clamp transistors;
in the third phase, concurrently continue to apply the positive voltage to the word lines, the turn off voltage to the source end select gate transistors, and the turn on voltage to the drain end select gate transistors, and apply a turn off voltage to the clamp transistors; and
in the fourth phase, concurrently sense the plurality of NAND strings, continue to apply the positive voltage to the word lines, the turn off voltage to the source end select gate transistors, and the turn on voltage to the drain end select gate transistors, and apply a second turn on voltage to the clamp transistors.
2. The apparatus of claim 1, wherein:
the second turn on voltage is greater than the first turn on voltage.
3. The apparatus of claim 1, wherein:
the positive voltage comprises a read pass voltage.
4. The apparatus of claim 1, wherein:
the control circuit is configured to count a number of NAND strings among the plurality of NAND strings which are in a non-conductive state according to the sensing and determine whether the number exceeds a threshold.
5. The apparatus of claim 1, wherein:
the sensing of the plurality of NAND strings occurs concurrently via the plurality of bit lines using all bit line sensing.
6. The apparatus of claim 1, wherein:
the plurality of NAND strings comprise a short circuited NAND string having a channel short circuited to a word line.
7. The apparatus of claim 1, wherein:
the plurality of NAND strings comprise one short circuited NAND string having a bit line contact short circuited to a bit line contact of another NAND string.
8. The apparatus of claim 7, wherein:
the bit line contact of the one short circuited NAND string is short circuited to the bit line contact of the another short circuited NAND string via a doped silicon region extending from the bit line contact of the one short circuited NAND string to the bit line contact of the another short circuited NAND string.
9. The apparatus of claim 1, wherein:
the plurality of NAND strings comprise a short circuited NAND string;
a voltage of a bit line connected to the short circuited NAND string is higher than a voltages of non-short circuited NAND strings of the plurality of NAND strings during the sensing; and
the non-short circuited NAND strings are not short circuited to another NAND string and are not short-circuited to a word line.
10. The apparatus of claim 1, wherein:
the plurality of NAND strings comprise a short circuited NAND string;
voltages of bit lines connected to non-short circuited NAND strings of the plurality of NAND strings are boosted in the second phase and discharged in the third phase;
a voltage of a bit line connected to the short circuited NAND string is higher than the voltages of the non-short circuited NAND strings throughout the second phase and the third phase; and
the non-short circuited NAND strings comprise NAND strings which are not short circuited to another NAND string and are not short-circuited to a word line.
11. A method, comprising:
performing a bit line pre-charge phase of a short circuit detection operation for a plurality of NAND strings, the plurality of NAND strings are connected to a plurality of word lines and comprise a short circuited NAND string and non-short circuited NAND strings, each NAND string is connected to a respective bit line of a plurality of bit lines, each bit line is connected to a clamp transistor which is configured to clamp a voltage of the bit line, and the performing the bit line pre-charge phase comprises biasing the clamp transistors to charge up the bit lines of the non-short circuited NAND strings while applying a positive voltage to the plurality of word lines;
performing a bit line discharge phase of the short circuit detection operation, the performing the bit line discharge phase comprises turning off the clamp transistors to discharge the bit lines of the non-short circuited NAND strings while continuing to apply the positive voltage to the plurality of word lines; and
performing a sensing phase of the short circuit detection operation, the performing the sensing phase comprises connecting sense circuits to the bit lines of the non-short circuited NAND strings and to a bit line of the short circuited NAND string while continuing to apply the positive voltage to the plurality of word lines.
12. The method of claim 11, wherein the plurality of NAND strings are in a block, the method further comprising:
based on the sensing, counting a number of short circuited NAND strings; and
determining that the block is unusable if the number exceeds a threshold.
13. The method of claim 11, further comprising:
based on the sensing, distinguishing the short circuited NAND string from the non-short circuited NAND strings.
14. The method of claim 11, wherein:
the short circuited NAND string is sensed as being in a non-conductive state and the non-short circuited NAND strings are sensed as being in a conductive state.

15. The method of claim 11, wherein:

the short circuited NAND string is short circuited to a word line of the plurality of word lines; and the positive voltage applied to the a word line charges up a bit line of the short circuited NAND string during the bit line pre-charge phase, the bit line discharge phase and the sensing phase.

16. The method of claim 11, further comprising:

performing a channel pre-clean phase of the short circuit detection operation before the performing of the bit line pre-charge phase, the performing the channel pre-clean phase comprises initiating the applying of the positive voltage to the plurality of word lines while turning off the clamp transistors, biasing a drain side select gate transistor with a turn on voltage, and biasing a source side select gate transistor of each NAND string with a turn on voltage followed by a turn off voltage.

17. An apparatus, comprising:

a control circuit configured to connect to a plurality of NAND strings, the plurality of NAND strings are connected to a plurality of word lines and comprise a first short circuited NAND string which is short circuited to a leaky word line of the plurality of word lines, a second short circuited NAND string which is short circuited to the first short circuited NAND string, and non-short circuited NAND strings, which are not short circuited to another NAND string and are not short circuited to a word line, each NAND string is connected to a respective bit line of a plurality of bit lines; and a memory interface connected to the control circuit, the control circuit is configured to issue a command via the memory interface to perform an operation which distinguishes the first short circuited NAND string and the second short circuited NAND string from the non-short circuited NAND strings, the operation involves sensing the plurality of NAND strings after pre-charging and discharging bit lines connected to the non-short circuited NAND strings while a bit line connected to the first short circuited NAND string is charged up by a voltage applied to the leaky word line, the leaky word line is electrically connected to the bit line of the first short circuited NAND string via a channel of the first short circuited NAND string.

18. The apparatus of claim 17, wherein:

the leaky word line is electrically connected to the bit line of the second short circuited NAND string via a short circuit path between a bit line contact of the first short circuited NAND string and a bit line contact of the second short circuited NAND string.

19. The apparatus of claim 18, wherein:

the short circuit path comprises a doped silicon region between the bit line contact of the first short circuited NAND string and the bit line contact of the second short circuited NAND string.

20. The apparatus of claim 17, wherein:

the first short circuited NAND string and the second short circuited NAND string are in a cluster of short circuited NAND strings.

\* \* \* \* \*